US012740036B2

(12) United States Patent
Hirose

(10) Patent No.: US 12,740,036 B2
(45) Date of Patent: Sep. 15, 2026

(54) SEMICONDUCTOR INTEGRATED CIRCUIT DEVICE WITH WELL TAP CELLS

(71) Applicant: Socionext Inc., Yokohama (JP)

(72) Inventor: Masanobu Hirose, Yokohama (JP)

(73) Assignee: Socionext Inc., Kanagawa (JP)

( * ) Notice: Subject to any disclaimer, the term of this patent is extended or adjusted under 35 U.S.C. 154(b) by 117 days.

(21) Appl. No.: 18/506,989

(22) Filed: Nov. 10, 2023

(65) Prior Publication Data

US 2024/0081035 A1 Mar. 7, 2024

Related U.S. Application Data

(63) Continuation of application No. PCT/JP2022/019374, filed on Apr. 28, 2022.

(30) Foreign Application Priority Data

May 12, 2021 (JP) ................................ 2021-080800

(51) Int. Cl.
*G11C 11/412* (2006.01)
*G11C 11/419* (2006.01)
*H10B 10/00* (2023.01)

(52) U.S. Cl.
CPC ............ *H10B 10/12* (2023.02); *G11C 11/412* (2013.01); *G11C 11/419* (2013.01)

(58) Field of Classification Search
CPC ...... G11C 11/412; G11C 11/419; H10B 10/12
USPC .......................................................... 365/154
See application file for complete search history.

(56) References Cited

U.S. PATENT DOCUMENTS 11,837,280 B1 * 12/2023 Moroz .................. H10B 10/12
2002/0117722 A1 8/2002 Osada
2011/0157965 A1 * 6/2011 Nii ...................... G11C 11/4125 365/156
2013/0026580 A1 1/2013 Morimoto et al.
2019/0074296 A1 * 3/2019 Ryu ..................... H10D 84/907
2020/0365603 A1 11/2020 Moriwaki
2021/0074350 A1 * 3/2021 Vincent .................. H10B 10/12
(Continued)

FOREIGN PATENT DOCUMENTS

JP 2001-028401 A 1/2001
JP 2013-026594 A 2/2013
JP 2021-061278 A 4/2021
(Continued)

OTHER PUBLICATIONS

International Search Report received in PCT Application No. PCT/JP2022/019374, mailed Jul. 26, 2022.
(Continued)

*Primary Examiner* — Sung Il Cho
(74) *Attorney, Agent, or Firm* — RIMON P.C.

(57) ABSTRACT

A memory cell includes a power supply line extending in a Y-direction and configured to supply a power supply voltage. A well tap cell includes: a power supply line extending in the Y-direction, electrically connected to the power supply line, and configured to supply the power supply voltage; and a line formed in an M1 line layer, extending in an X-direction, electrically connected to the power supply line, and configured to supply the power supply voltage. The well tap cell supplies the power supply voltage to an N-well or a P-type substrate of the memory cell.

15 Claims, 21 Drawing Sheets

(56) References Cited

U.S. PATENT DOCUMENTS

| | | | | |
|---|---|---|---|---|
| 2022/0037339 | A1* | 2/2022 | Lee | H10B 10/12 |
| 2022/0115388 | A1 | 4/2022 | Hirose | |

FOREIGN PATENT DOCUMENTS

| | | | |
|---|---|---|---|
| WO | 2019/155559 | A1 | 8/2019 |
| WO | 2020/255655 | A1 | 12/2020 |

OTHER PUBLICATIONS

Written Opinion received in PCT Application No. PCT/JP2022/019374, mailed Jul. 26, 2022.

* cited by examiner

C2
C21
C22
NWell
BPR
Gate
nanosheet
LI
M1
M2
Via(BPR-LI)
Via(Gate, Shared-contact)
Via(LI-M1)
Via(M1-M2)
N-DOPED REGION
P-DOPED REGION
VSS
X
Y NWell
BPR
Gate
nanosheet
LI
M1
M2
Via(BPR-LI)
Via(Gate, Shared-contact)
Via(LI-M1)
Via(M1-M2)
N-DOPED REGION
P-DOPED REGION
C2
C21
C22
C21
X
Y
265
272
271
285b
171
185b
171
63
61
62
285c
BL
VDD
BLB
264
VSS
VDD
285a
VSS
185a
VSS NWell
BPR
Gate
nanosheet
LI
M1
M2
Via(BPR-LI)
Via(Gate, Shared-contact)
Via(LI-M1)
Via(M1-M2)
N-DOPED REGION
P-DOPED REGION
X
Y
11(12)
111(112)
211(212)
WL
VSS
VDD
BLB
BL
PG2
PD2
PU2
PU1
PD1
PG1
dm1
dm2
dm3
dm4
dm5
dm6
C1
C21
C22

NWell
BPR
Gate
nanosheet
LI
M1
M2
Via(BPR-LI)
Via(Gate, Shared-contact)
Via(LI-M1)
Via(M1-M2)
N-DOPED REGION
P-DOPED REGION
C5
C51
C52
C51
X
Y
265
272
271
285b
171
171
63
61
62
285c
BL
VDD
BLB
264
285a
VSS
VDD
VSS
VSS C7
C51a
C52
C51
112
212
112
103
101
102
113
113
206
204
205
213
283e
283f
255
256
dm1
dm2
dm3
dm4
dm5
dm6
VSS
VSS
111
211
111

C7
C51a
C52
C51
NWell
BPR
Gate
nanosheet
LI
M1
M2
Via(BPR-LI)
Via(Gate, Shared-contact)
Via(LI-M1)
Via(M1-M2)
N-DOPED REGION
P-DOPED REGION
265
173
273
271
272
171
63
61
62
264
185e
285e
285d
61a
61
BL
VDD
BLB
VSS
VDDB
VSS
VDD
VSS NWell
BPR
Gate
nanosheet
LI
M1
M2
Via(BPR-LI)
Via(Gate, Shared-contact)
Via(LI-M1)
Via(M1-M2)
N-DOPED REGION
P-DOPED REGION
C9
C91
C92
C91
265
67
174
175
63
61
62
264
272
271
RBL
174
175
BL
VDD
BLB
VSS
VSS
VDD
VSS
VSS
VSS

SEMICONDUCTOR INTEGRATED CIRCUIT DEVICE WITH WELL TAP CELLS

CROSS-REFERENCE TO RELATED APPLICATIONS

This is a continuation of International Application No. PCT/JP2022/019374 filed on Apr. 28, 2022, which claims priority to Japanese Patent Application No. 2021-080800 filed on May 12, 2021. The entire disclosures of these applications are incorporated by reference herein.

BACKGROUND

The present disclosure relates to a semiconductor memory device including memory cells.

To achieve high integration of a semiconductor memory device, there has been proposed a use of a buried power rail (BPR) that is a power supply line provided in a buried interconnect layer, instead of a power supply line provided in a metal line layer formed above transistors as in a traditional case.

In International Publication No. 2020/255655, a buried power rail constitutes power supply lines of SRAM cells (memory cells). In International Publication No. 2020/255655, power is supplied to each transistor of the SRAM cells via a buried interconnect.

SUMMARY

As the metal used for the buried power rail of memory cells, Co, Ru, W, Mo and the like have been discussed. These metals have resistance higher than that of a material such as Cu used for a traditional metal line layer provided above the transistors. An increase in the resistance of the power supply line may lower the performance, reliability, and yield of the semiconductor memory device, due to a drop in the power supply voltage and the like.

Increasing the line width of the buried power rail to reduce the resistance results in an increase in the area of the semiconductor memory device. Particularly, since the buried power rail is buried in the substrate, the buried power rail cannot be formed in a region where the sources, drains, and channels of the transistors exist. For this reason, an increase in the line width of the buried power rail leads to an increase in the area of the semiconductor memory device. It is also conceivable to increase the line thickness of the buried power rail to reduce the resistance. However, there is also a limit to increasing the thickness of the line.

An object of the present disclosure is to suppress an increase in the resistance of a power supply line, while using a buried power rail as the power supply line in a semiconductor memory device including memory cells.

An aspect of the present disclosure includes: first and second memory sub-arrays arranged side by side in a first direction; and a plurality of well tap cells arranged between the first and second memory arrays and arranged side by side in a second direction perpendicular to the first direction in plan view,

- wherein the first and second memory sub-arrays each include
- a plurality of memory cells arranged in an array, and
- a first buried power rail formed in a buried interconnect layer, extending in the first direction, and configured to supply a first power supply voltage,
- wherein the well tap cells include
- a second buried power rail formed in the buried interconnect layer, extending in the first direction, electrically connected to the first buried power rail, and configured to supply the first power supply voltage, and
- a first line formed in a line layer above the buried interconnect layer, extending in the second direction, electrically connected to the second buried power rail, and configured to supply the first power supply voltage, and
- wherein the well tap cell supplies a second power supply voltage to an N-well in the memory cell or to a P-type substrate.

According to the aspect, the first line that supplies the first power supply voltage is formed in the line layer above the buried interconnect layer of the well tap cell. The first line is electrically connected to the first buried interconnect formed in the buried interconnect layer of the memory cell, through the second buried power rail formed in the buried interconnect layer of the well tap cell. This way, the power supply of the first buried power rail of the memory cell can be strengthened, and it is therefore possible to suppress an increase in the resistance of a power supply line, while using a buried power rail as the power supply line in a semiconductor memory device including memory cells. Further, since the well tap cell supplies the second power supply voltage to the N-well or the P-type substrate of the memory cell, the potentials of the N-well or the P-type substrates of the memory cell can be fixed.

With the present disclosure, it is possible to suppress an increase in the resistance of a power supply line, while using a buried power rail as the power supply line in a semiconductor memory device including memory cells.

DETAILED DESCRIPTION

Embodiments will be described in detail with reference to the drawings. The following embodiments assume that a semiconductor memory device includes a plurality of memory cells (hereinafter, simply referred to as cells as appropriate, in the present specification), and that at least some of the plurality of memory cells include, for example, a nanosheet field effect transistor (nanosheet FET). The nanosheet FET is an FET using a thin sheet (nanosheet) through which a current flows. The nanosheet is made of silicon, for example. Further, a semiconductor layer portion that is formed at each end of the nanosheet and that constitutes a terminal to serve as the source or the drain of the nanosheet FET will be referred to as "pad" in the present disclosure.

In the present disclosure, "VDD" and "VSS" indicate a power supply voltage or power supply itself. It should be noted that, in the following description, the lateral direction of the figure in the plan view of FIG. 1 or the like is the X-direction (corresponding to the second direction), the longitudinal direction is Y-direction (corresponding to the first direction), and a direction perpendicular to the substrate surface is the Z-direction.

Further, the source and drain of the transistor is referred to as "node" of the transistor where appropriate in the present disclosure. That is, one node of a transistor indicates the source or the drain of the transistor, and both nodes of a transistor indicate the source and the drain of the transistor.

Embodiment (Layout Configuration of Circuit Block)

Figure 1:
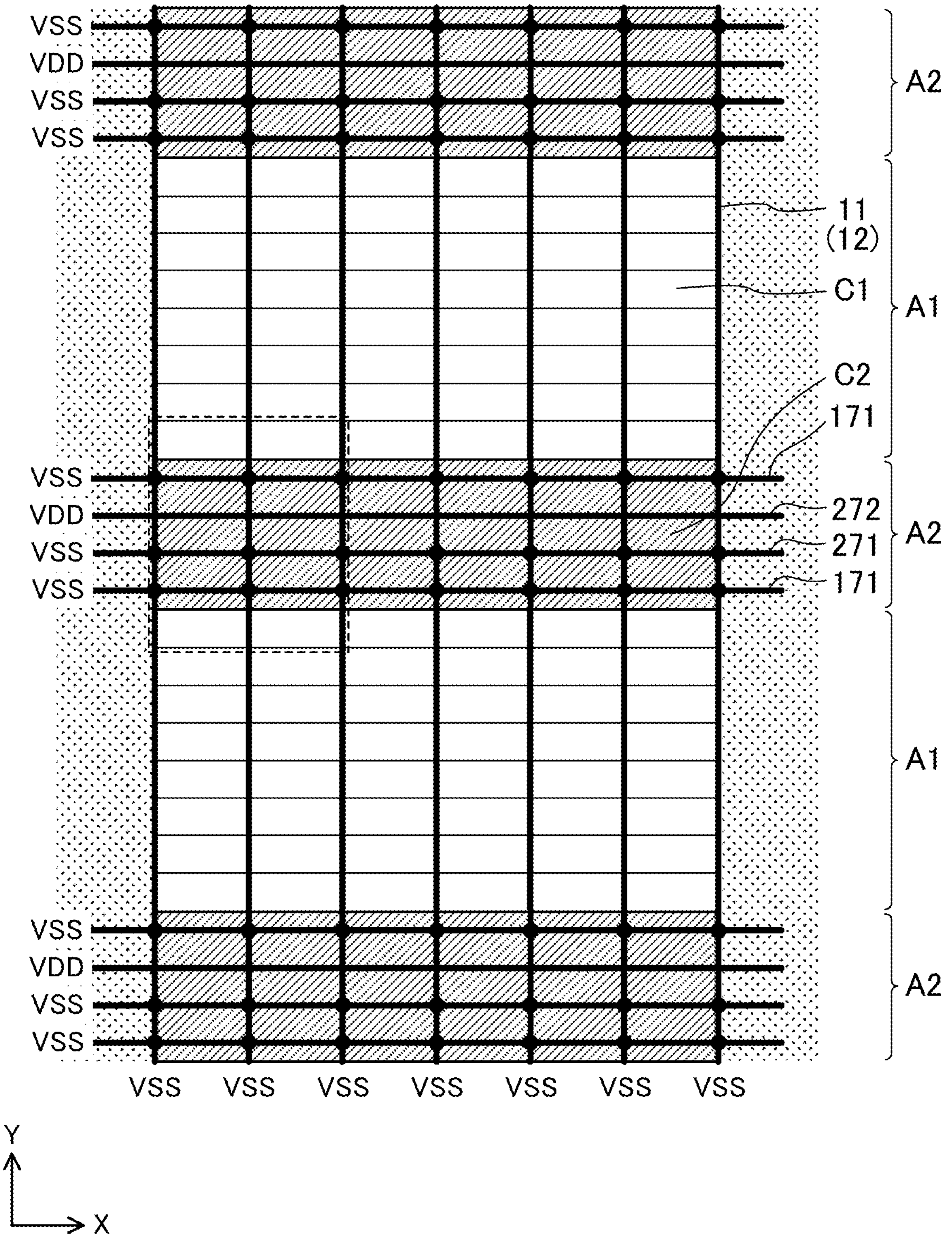
FIG. 1 shows an exemplary circuit block layout configuration of a semiconductor memory device related to an embodiment.

FIG. 1 shows an exemplary circuit block layout configuration of a semiconductor memory device related to an embodiment. FIG. 1 schematically shows an arrangement of each cell, a buried power rail in a buried interconnect layer, and a power supply line in an M2 line layer, and shows a relation of connection between the buried power rail and the power supply line of the M2 line layer.

In the layout shown in FIG. 1, a well tap cell part A2 is arranged at the upper end and the lower end of the circuit block in the figure and between memory sub-arrays A1.

Each memory sub-array A1 includes a plurality of memory cells C1 (SRAM cells). Specifically, in each memory sub-array A1, there are six memory cells C1 arranged in the X-direction and eight memory cells C1 in the Y-direction. Further, in the X-direction of the memory cells C1 in each memory sub-array A1, cells arranged in a forward direction and cells inverted in the X-direction are alternately arranged side by side. Further, in the Y-direction of the memory cells C1 in each memory sub-array A1, cells arranged in a forward direction and cells inverted in the Y-direction are alternately arranged side by side.

Further, each well tap cell part A2 includes well tap cells C2 arranged side by side in the X-direction. The well tap cells C2 are each provided to fix the potentials of N-wells and the P-type substrates of each memory cell C1, as will be detailed later.

As shown in FIG. 1, power supply lines 11 (12) are each formed so as to extend in the Y-direction at a boundary between a memory cell C1 arranged in the memory sub-array A1 and an adjacent memory cell C1 in the X-direction. The power supply lines 11 (12) are connected to power supply lines 111 (112), 211 (212) formed in the well tap cell C2 arranged in the well tap cell part A2. The power supply lines 111(112), 211(212) are each formed in the buried interconnect layer, and are connected to lines 171 and 271 formed in an M2 line layer and for supplying a power supply voltage VSS. Since the lines 171 and 271 allow strengthening of power supply of the power supply lines 11 (12) formed in the buried interconnect layer, an increase in the resistance of the power supply lines can be suppressed while using the buried power rails as the power supply lines.

(Circuit Configuration of Memory Cell)

Figure 2:
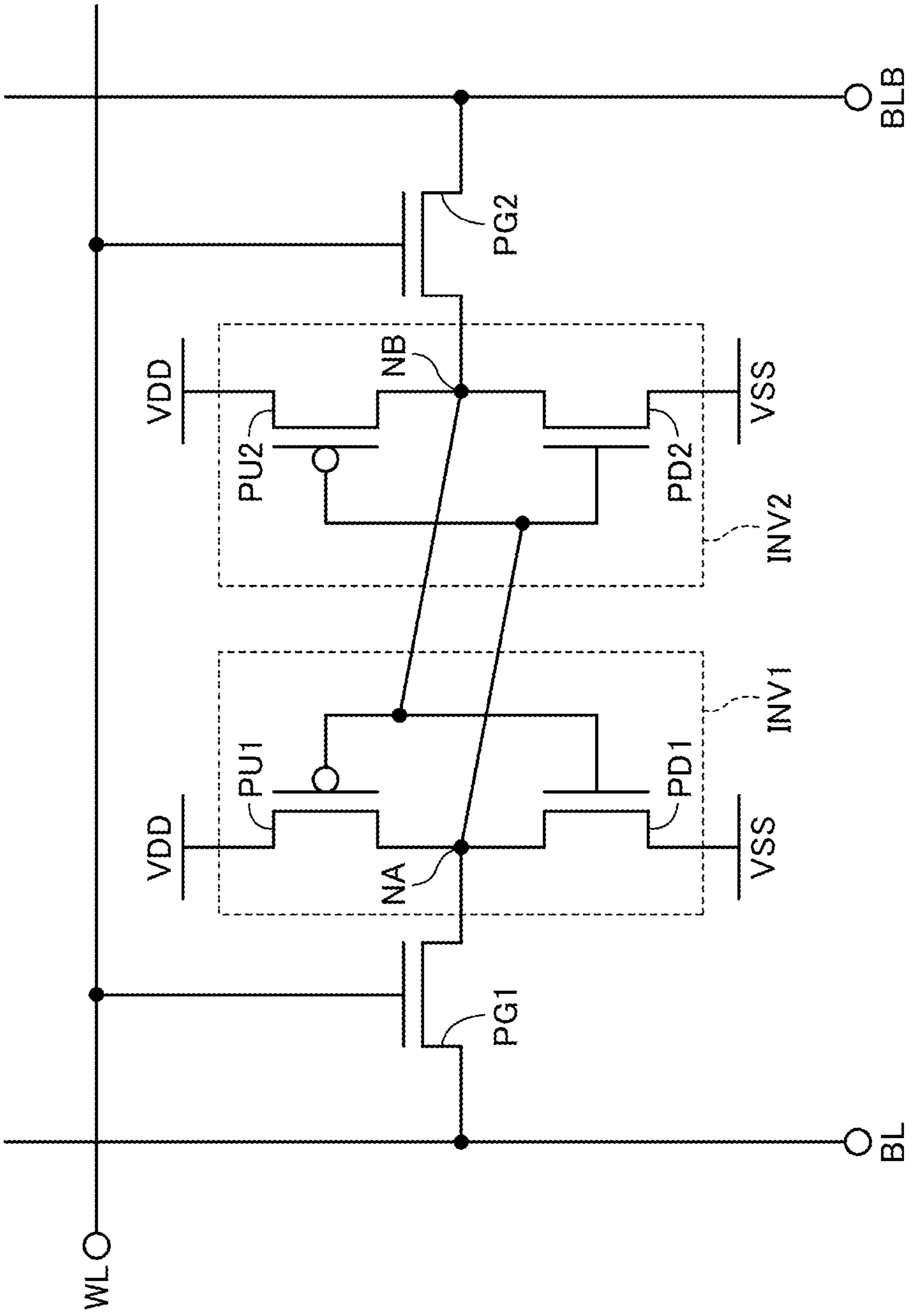
FIG. 2 is a circuit diagram showing a configuration of a memory cell C1.

FIG. 2 is a circuit diagram showing a configuration of a memory cell C1. In the memory cell C1, a memory cell circuit including load transistors PU1 and PU2, drive transistors PD1 and PD2, and access transistors PG1 and PG2 is configured as shown in FIG. 2. The load transistors PU1 and PU2 are each a P-type FET. The drive transistors PD1 and PD2 and the access transistors PG1 and PG2 are each an N-type FET.

The load transistor PU1 is provided between a power supply voltage VDD and a first node NA, and the drive transistor PD1 is provided between the first node NA and the power supply voltage VSS. The load transistor PU1 and the drive transistor PD1 have their gates connected to a second node NB to configure an inverter INV1. The load transistor PU2 is provided between the power source VDD and the second node NB, and the drive transistor PD2 is provided between the second node NB and the power source VSS. The load transistor PU2 and the drive transistor PD2 have their gates connected to the first node NA to configure an inverter INV2. That is, an output of one of the inverters is connected to an input of the other inverter, thereby configuring a latch.

The access transistor PG1 is provided between a bit line BL and the first node NA, and the gate thereof is connected to a word line WL. The access transistor PG2 is provided between a bit line BLB and the second node NB, and the gate thereof is connected to the word line WL. The bit lines BL and BLB constitute a complementary bit line pair.

In the memory cell circuit, while the bit lines BL and BLB constituting the complementary bit line pair are driven to a high level and a low level, respectively, driving the word line WL to the high level causes the high level to be written to the first node NA and the low level to the second node NB. On the other hand, while the bit lines BL and BLB are driven to the low level and a high level, respectively, driving the word line WL to the high level causes the low level to be written to the first node NA and the high level to the second node NB. Then, while data is written to the first and second nodes NA and NB, driving the word line WL to the low level determines a latch state and retains the data written to the first and second nodes NA and NB.

Further, with the bit lines BL and BLB are pre-charged in advance to the high level, driving the word line WL to the high level determines the state of each of the bit lines BL and BLB according to the data written to the first and second nodes NA and NB, and data can be read out from the memory cell. Specifically, when the first node NA is at the high level and the second node NB is at the low level, the bit line BL is held at the high level and the bit line BLB is discharged to the low level. On the other hand, when the first node NA is at the low level and the second node NB is at the high level, the bit line BL is discharged to the low level and the bit line BLB is held at the high level.

As described above, the memory cell C1 has functions of writing data to the memory cell, retaining data, and reading out data from the memory cell by controlling the bit lines BL and BLB and the word line WL.

(Layout Configuration of Memory Cell)

Figure 3:
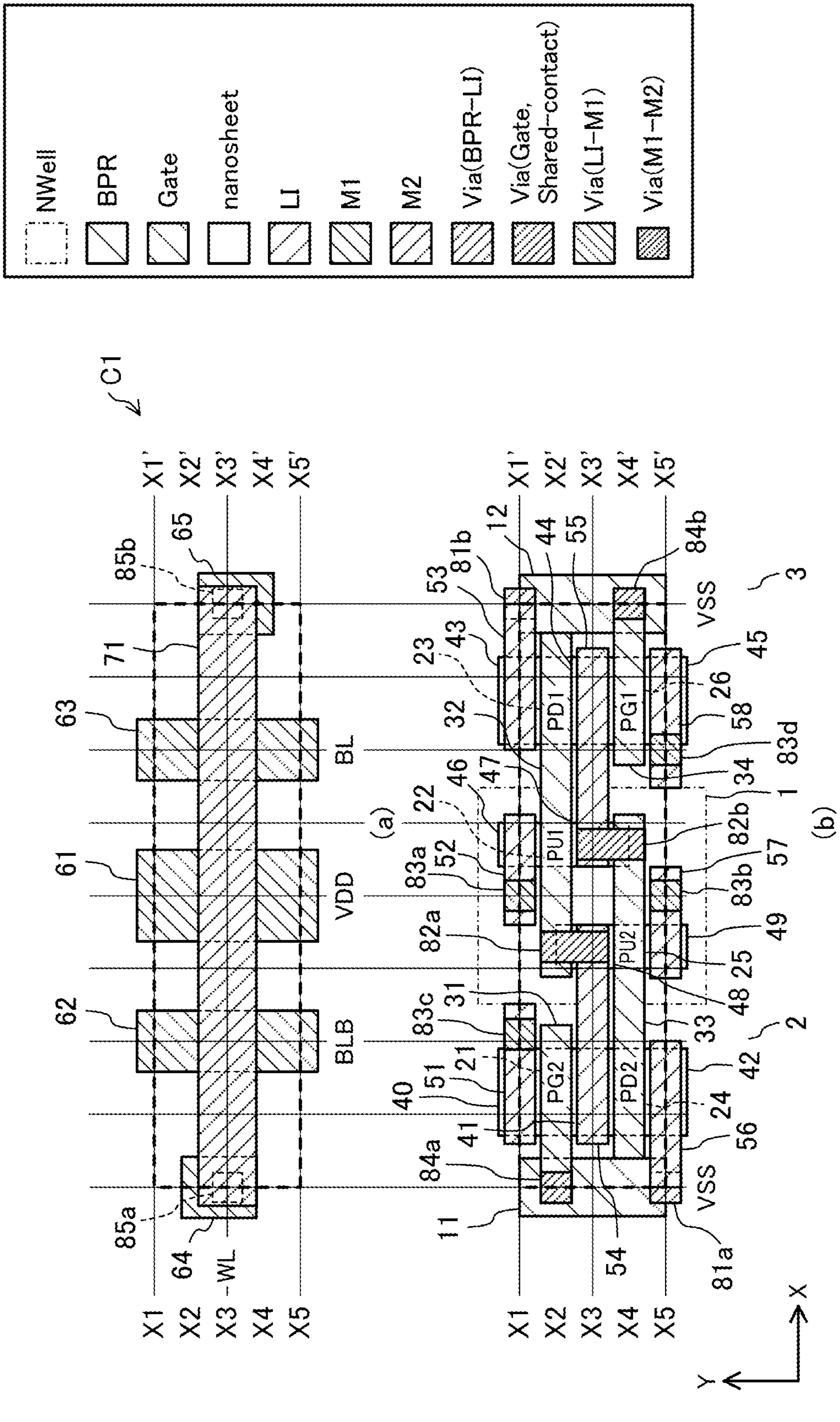
FIG. 3 is a plan view showing an exemplary layout configuration of the memory cell C1, in which (a) shows a cell upper part and (b) shows a cell lower part.
Figure 4:
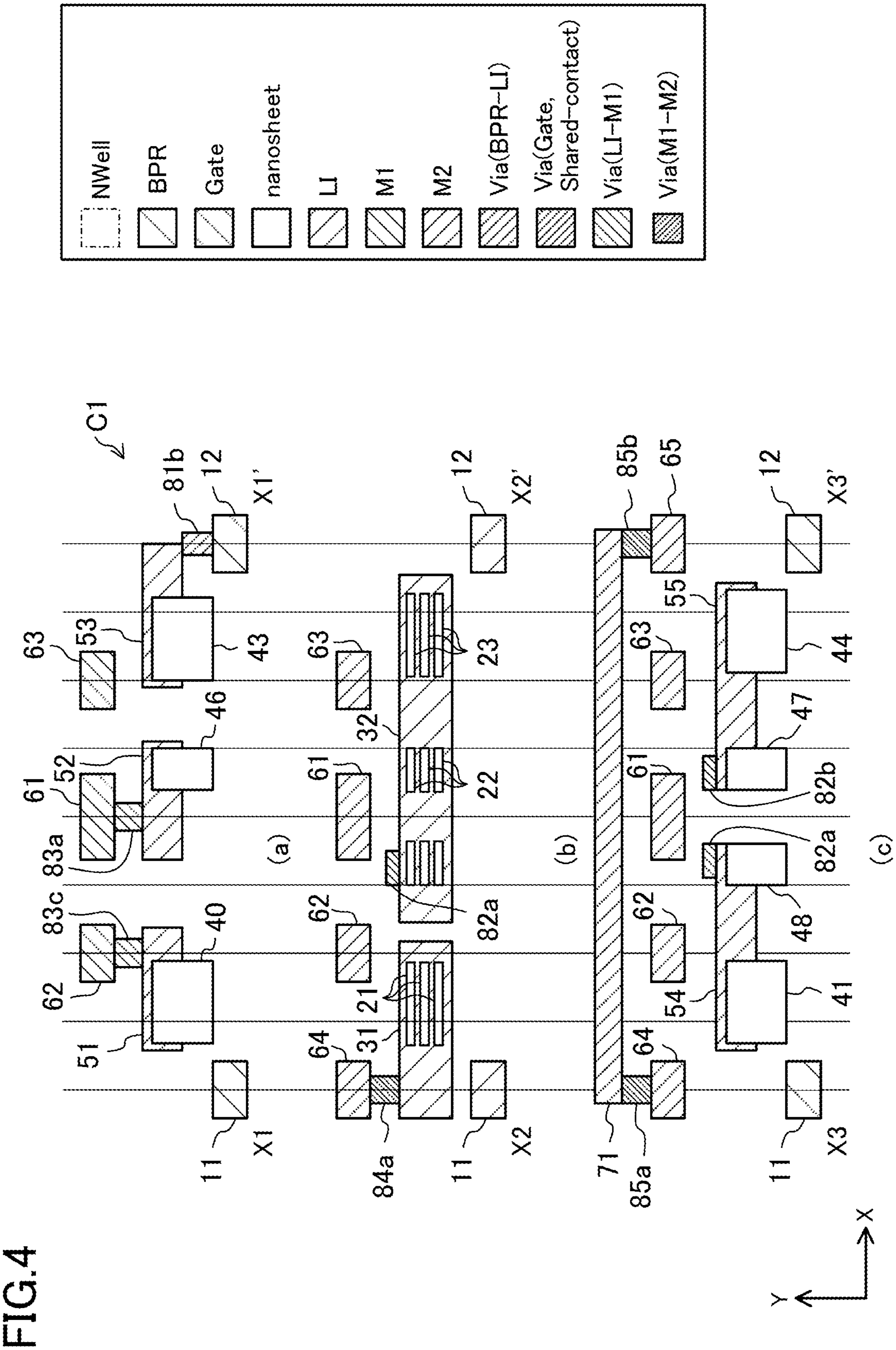
FIG. 4 is a cross-sectional view showing an exemplary layout configuration of the memory cell C1.
Figure 5:
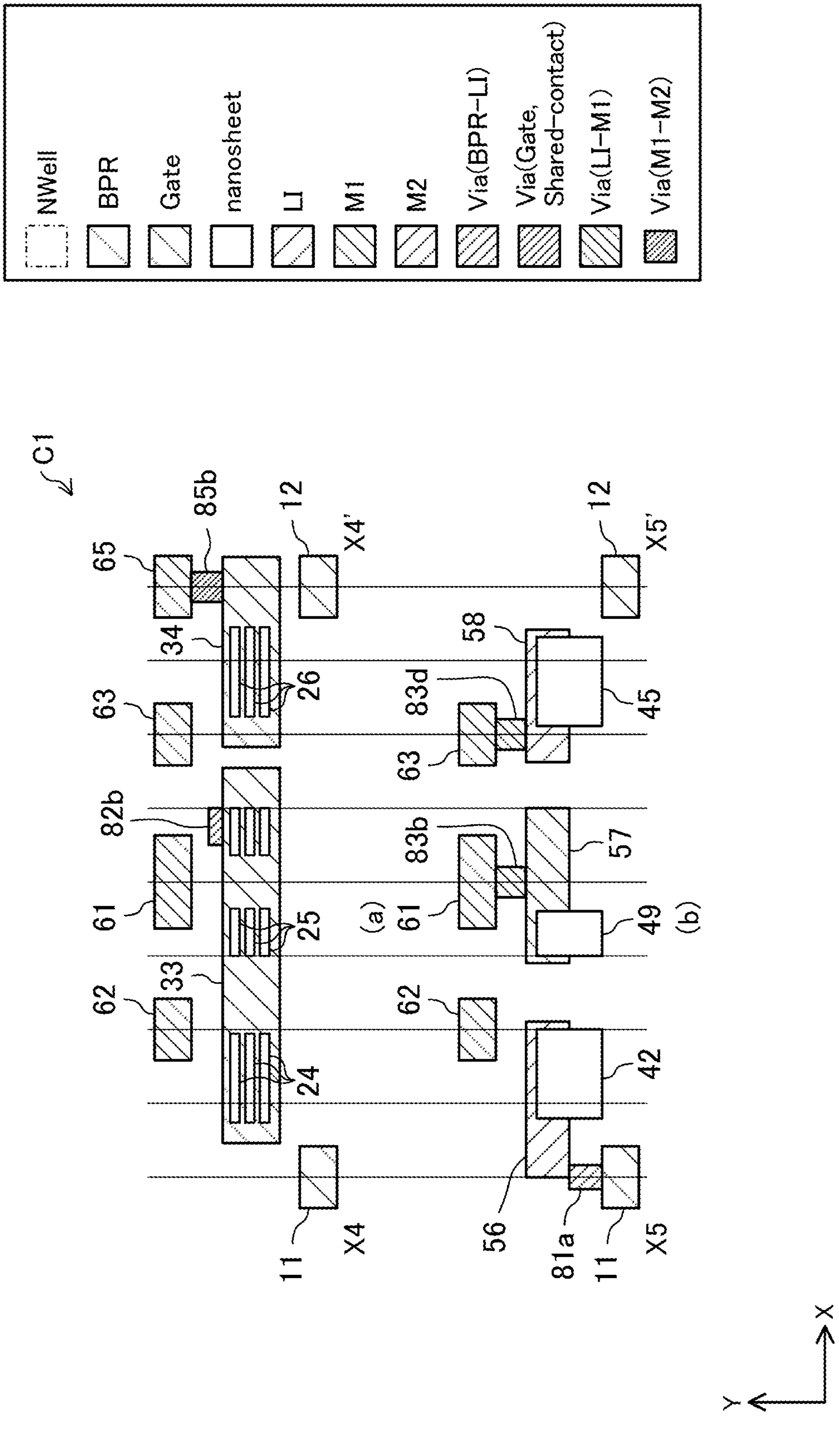
FIG. 5 is a cross-sectional view showing an exemplary layout configuration of the memory cell C1.

FIG. 3 to FIG. 5 are diagrams showing an exemplary layout configuration of the memory cell C1. Illustrations (a) and (b) of FIG. 3 are each a plan view, and illustrations (a) to (c) of FIG. 4 and (a) and (b) of FIG. 5 are each a cross-sectional view seen from a lateral direction in plan view. Specifically, an illustration (a) of FIG. 3 shows a cell upper part that is the M1, M2 line layers, and an illustration (b) of FIG. 3 shows a cell lower part that is a layer below the M1, M2 line layers and includes a nanosheet FET. The illustration (a) of FIG. 4 is a cross-section taken along line X1-X1'. The illustration (b) of FIG. 4 is a cross-section taken along line X2-X2'. The illustration (c) of FIG. 4 is a cross-section taken along line X3-X3'. The illustration (a) of FIG. 5 is a cross-section taken along line X4-X4'. The illustration (b) of FIG. 5 is a cross-sectional view taken along line X5-X5'.

In the following description, solid lines running longitudinally and laterally in the plan view of FIG. 3 and solid lines running longitudinally in the cross-sectional view of FIG. 4 and the like illustrate a grid used for arranging components at the time of designing. Cells of the grid are arranged at equal intervals in the X-direction, and arranged at equal intervals in the Y-direction. It should be noted that the intervals of the cells in the X-direction and those in the Y-direction may be the same or different. Further, the intervals of the cells may be different in each layer. Further, each part does not necessarily have to be arranged on the grid. However, for the sake of reducing manufacturing-attributed variations, the parts are arranged on the grid in one preferred embodiment.

As shown in the illustration (b) of FIG. 3, power supply lines 11 and 12 extending in the Y-direction are formed over both upper and lower ends of the cell in the drawing. The power supply lines 11 and 12 are each buried power rail (BPR) formed in the buried interconnect layer. The power supply lines 11 and 12 are formed at both left and right ends of the cell in the drawing. The power supply lines 11 and 12 supply the power supply voltage VSS.

Further, the load transistors PU1 and PU2 are formed on an N-well 1. The access transistor PG2 and the drive transistor PD2 are formed on a P-type substrate 2. The drive transistor PD1 and the access transistor PG1 are formed on a P-type substrate 3.

As shown in the illustration (b) of FIG. 3, nanosheets 21 to 26 extending in the X-direction and the Y-direction are formed. The nanosheets 21 to 26 constitute channel parts of the access transistor PG2, the load transistor PU1, the drive transistor PD1, the drive transistor PD2, the load transistor PU2, and the access transistor PG1, respectively.

Gate lines (Gate) 31 to 34 extend in the X-direction and the Z-direction. The gate line 31 serves as the gate of the access transistor PG2. The gate line 32 serves as the gates of the load transistor PU1 and the drive transistor PD1. The gate line 33 serves as the gates of the drive transistor PD2 and the load transistor PU2. The gate line 34 serves as the gate of the access transistor PG1.

Pads 40 to 45 doped with an N-type impurity are formed at the upper end of the nanosheet 21 in the drawing, between the nanosheets 21 and 24, the lower end of the nanosheet 24 in the drawing, the upper end of the nanosheet 23 in the drawing, between the nanosheets 23 and 26, and the lower end of the nanosheet 26 in the drawing, respectively. The pads 40 and 41 constitute a node of the access transistor PG2. The pads 41 and 42 constitute a node of the drive transistor PD2. The pads 43 and 44 constitute a node of the drive transistor PD1. The pads 44 and 45 constitute a node of the access transistor PG1.

Pads 46 to 49 doped with a P-type impurity are formed at the upper end of the nanosheet 22 in the drawing, the lower end of the nanosheet 22 in the drawing, the upper end of the nanosheet 25 in the drawing, and the lower end of the nanosheet 25 in the drawing, respectively. The pads 46 and 47 constitute a node of the load transistor PU1. The pads 48 and 49 constitute a node of the load transistor PU2.

In a local interconnect layer, local interconnects (LIs) 51 to 58 extending in the X-direction are formed. The local interconnect 51 is connected to the pad 40. The local interconnect 52 is connected to the pad 46. The local interconnect 53 is connected to the pad 43. The local interconnect 54 is connected to the pads 41 and 48. The local interconnects 55 is connected to the pads 47 and 44. The local interconnect 56 is connected to the pad 42. The local interconnect 57 is connected to the pad 49. The local interconnect 58 is connected to the pad 45.

Further, the local interconnect 56 is connected to the power supply line 11 through a contact 81*a*(Via). The local interconnect 53 is connected to the power supply line 12 through a contact 81*b*.

The local interconnect 54 is connected to the gate line 32 through a shared-contact 82*a*. The local interconnect 55 is connected to the gate line 33 through a shared-contact 82*b*. Note that the gate line 33, the local interconnect 55, and the shared-contact 82*b* correspond to a first node NA. The gate line 32, the local interconnect 54, and the shared-contact 82*a* correspond to a second node NB.

As shown in illustration (a) of FIG. 3, lines 61 to 65 are formed in the M1 line layer. The lines 61 to 63 extend in the Y-direction to both upper and lower ends of the cell in the drawing. The line 61 supplies the power supply voltage VDD. The lines 62 and 63 correspond to the bit lines BLB and BL, respectively.

The line 61 is connected to the local interconnect 52 through a contact (Via) 83*a*, and connected to the local interconnect 57 through a contact 83*b*. The line 62 is connected to the local interconnect 51 through a contact 83*c*. The line 63 is connected to the local interconnect 58 through a contact 83*d*. The line 64 is connected to the gate line 31 through a contact (Gate-contact) 84*a*. The line 65 is connected to the gate line 34 through a contact 84*b*.

A line 71 extending in the X-direction from the left end to the right end of the cell in the drawing is formed in the M2 line layer above the M1 line layer. The line 71 corresponds to the word line WL. The line 71 is connected to the line 64 through a contact 85*a*, and connected to the line 65 through a contact 85*b*.

As shown in illustration (b) of FIG. 4 and illustration (a) of FIG. 5, the nanosheets 21 to 26 are each constituted by three semiconductor sheets (nanosheets). That is, nanosheet FETs in the memory cell C1 each includes three nanosheets.

As described hereinabove, the memory cell C1 includes the line 61 that supplies the power supply voltage VDD to the M1 line layer and power supply lines 11 and 12 that supply the power supply voltage VSS to the buried interconnect layer, but no lines that supply power supply voltage VDD, VSS to the M2 line layer. Therefore, the line width of the line 71 corresponding to word line WL can be widened. This allows improvement of the performance of the semiconductor memory device.

Further, the memory cell C1 includes the power supply lines 11 and 12 formed in the buried interconnect layer, but no lines that supply the power supply voltage VSS to the M1 line layer. Therefore, the line widths of the lines 62 and 63 (corresponding to bit lines BLB and BL) can be widened. This allows improvement of the speed of the semiconductor memory device.

(Layout Configuration of Well Tap Cell)

Figure 6:
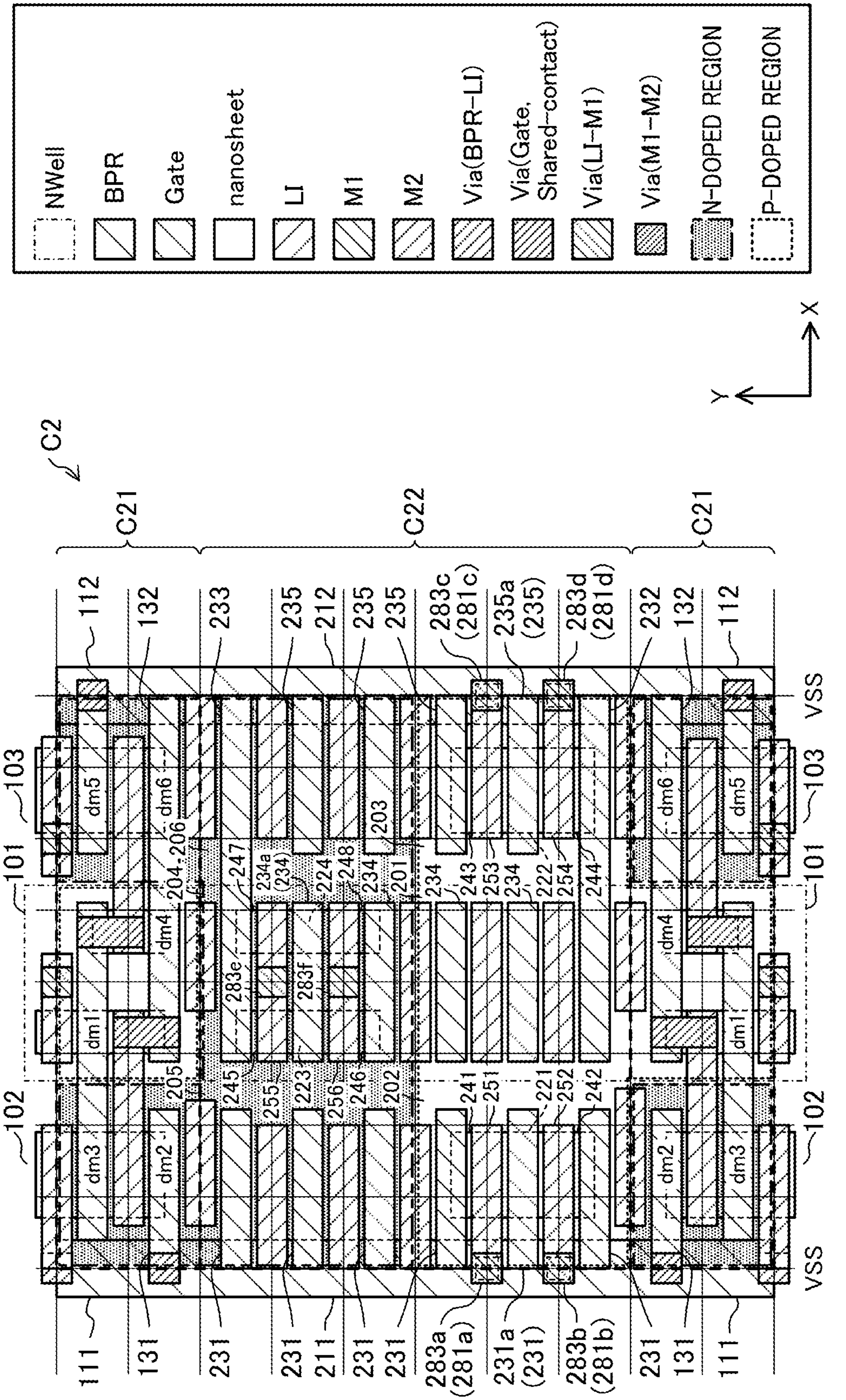
FIG. 6 is a plan view showing an exemplary layout configuration of a well tap cell C2.
Figure 7:
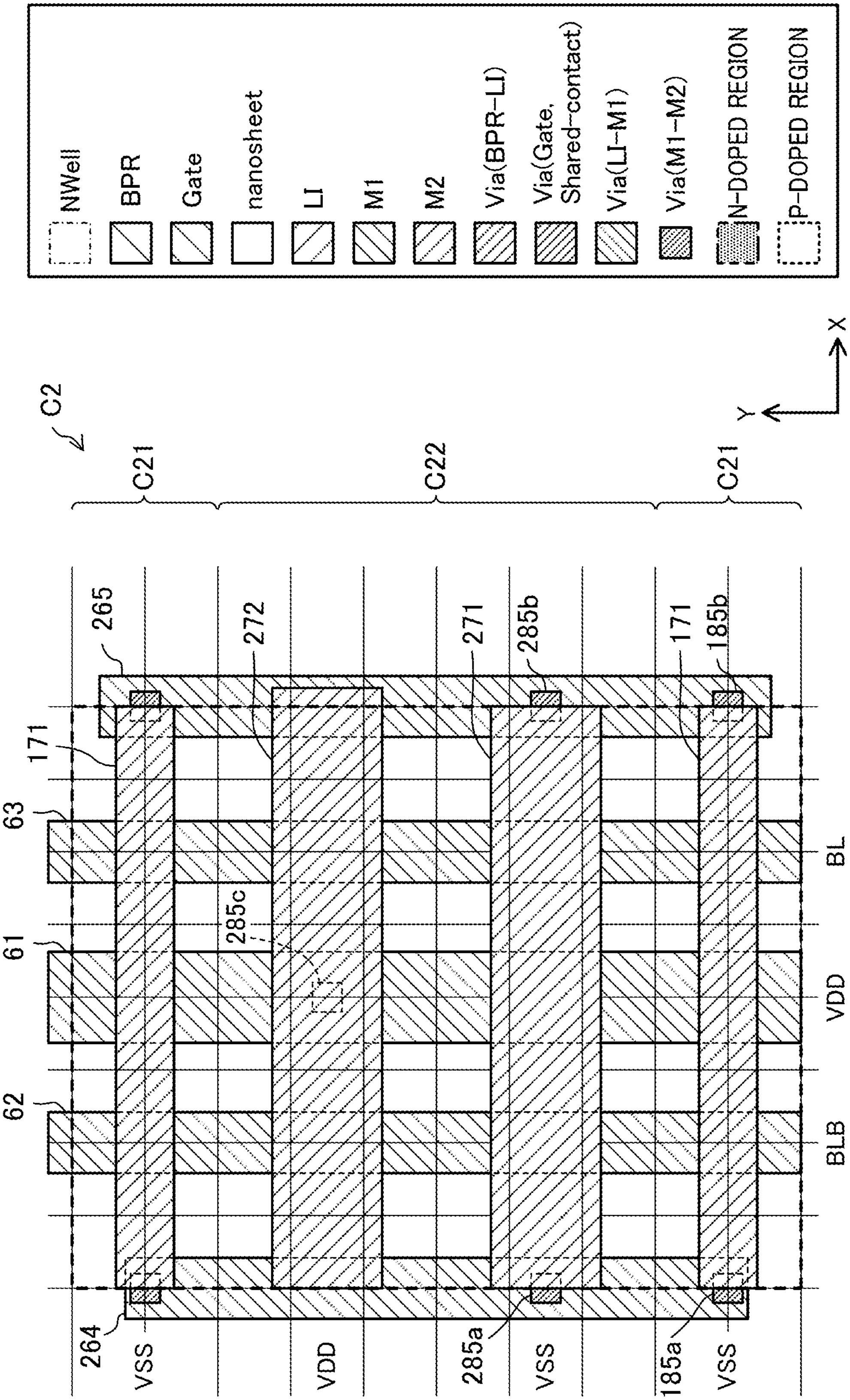
FIG. 7 is a plan view showing an exemplary layout configuration of the well tap cell C2.

FIG. 6 and FIG. 7 are diagrams showing an exemplary layout configuration of the well tap cell C2. Specifically, FIG. 6 shows the cell lower part and FIG. 7 shows the cell upper part.

As shown in FIG. 6, the well tap cell C2 includes dummy memory cell parts C21 arranged at the upper part and the lower part of the drawing and a well tap part C22 arranged in the middle of the drawing. The arrangement of the dummy memory cell part C21 in the upper part of the drawing is an inversion of the dummy memory cell part C21 arranged in the lower part of the figure in the Y-direction.

(Layout Configuration of Dummy Memory Cell Part)

Although each of the dummy memory cell parts C21 has substantially the same layout configuration as that of the memory cell C1, the pads 40, 43, 46 are not formed as compared with the memory cell C1. Further, the line 171 that supplies the power supply voltage VSS is arranged in the M2 line layer, instead of the line 71 corresponding to the word line WL. The transistors configured in the dummy memory cell parts C21 are transistors (dummy transistors dm1 to dm6) having no logic function.

In the following description, parts of the dummy memory cell part C21 which correspond to the N-well 1 and P-type substrates 2 and 3 of the memory cell C1 are referred to as N-well 101 and P-type substrates 102 and 103, respectively. Further, buried power rails in the dummy memory cell part C21, which correspond to the power supply lines 11 and 12 of the memory cell C1, are referred to as power supply lines 111 and 112.

The dummy memory cell part C21 is arranged so as to be adjacent, in the Y-direction, to the memory cell C1 arranged at a Y-directional end part of the memory sub-array A1. Further, the dummy memory cell part C21 has substantially the same layout configuration as that of the memory cell C1. As a result, manufacturing-attributed variations of the memory cell C1 arranged at the Y-directional end part of the memory sub-array A1 can be reduced.

Further, forming the line 171 of the M2 line layer to have the same line width as that of the line 71 (word line WL) of the memory cell C1 allows regular arrangement of the lines of the memory cell C1 and the M2 line layer in the dummy memory cell part C21.

Further, the line 171 is connected to a line 264 of the M1 line layer through a contact 185*a*, and connected to a line 265 of the M1 line layer through a contact 185*b*. The line 264 is connected to the power supply line 211 through contacts 283*a* (283*b*), local interconnects 251 (252), and contacts 281*a* (281*b*) which will be described later. The line 265 is connected to the power supply line 212 through contacts 283*c* (283*d*), the local interconnects 253 (254), and contacts 281*c* (281*d*) which will be described later. Further, the power supply lines 211 (212) are connected to the power supply lines 11 (12) of the memory cell C1 through the power supply lines 111 (112). This way, the line 171 supplies the power supply voltage VSS to the power supply lines 11 and 12, and therefore the power supply of the power supply lines 11 and 12 of the memory cell C1 can be strengthened.

Further, the dummy transistors on the N-wells 101 are doped with a P-type impurity and the dummy transistors on the P-type substrates 102 and 103 are doped with an N-type impurity.

(Layout Configuration of Well Tap Part)

In the buried interconnect layer of the well tap part C22, the power supply lines 211 and 212 are formed in boundaries of cells at the left and right ends of the drawing, respectively.

Further, in the well tap part C22, nanosheets 221 to 224 extending in the X-direction and the Y-direction are formed.

The well tap part C22 has an N-well in the middle of the drawing, and P-type substrates are formed on both left and right sides of the N-well. The nanosheet 221 is formed on the P-type substrate 202, and the nanosheet 222 is formed on the P-type substrate 203. The nanosheets 223 and 224 are formed on an N-well 204.

Pads 241 to 244 doped with a P-type impurity are formed in the upper part and the lower part of the nanosheet 221 in the drawing and in the upper part and the lower part of the nanosheet 222 in the drawing. Further, pads 245 to 248 doped with an N-type impurity are formed in the upper part and the lower part of the nanosheet 223 in the drawing and in the upper part and the lower part of the nanosheet 224 in the drawing.

Gate lines 231 to 235 extending in the X-direction and the Z-direction are arranged. Six gate lines 231 are arranged at equal intervals among the gate lines 131 (corresponding to the gate lines 31 of the memory cells C1) of the dummy memory cell parts C21 in the upper and lower parts of the drawing. Of the gate lines 231, a gate line 231*a* overlaps with the nanosheet 221 in plan view.

Further, the gate line 232 is arranged adjacent to the gate line 132 (corresponding to the gate line 32 of the memory cell C1) of the dummy memory cell part C21 in the lower part of the drawing. The gate line 233 is arranged adjacent to the gate line 132 of the dummy memory cell part C21 in the upper part of the drawing. Between the gate lines 232 and 233, four gate lines 234 arranged side by side in the Y-direction and four gate lines 235 arranged side by side in the Y-direction are arranged. Of the gate lines 234, a gate line 234*a* overlaps with the nanosheets 223 and 224 in plan view. Of the gate lines 235, a gate line 235*a* overlaps with the nanosheet 222 in plan view.

In the local interconnect layer, the local interconnects 251 to 256 extending in the X-direction are formed. The local interconnect 251 is connected to the pad 241. The local interconnect 252 is connected to the pad 242. The local interconnect 253 is connected to the pad 243. The local interconnect 254 is connected to the pad 244. The local interconnect 255 is connected to the pads 245 and 247. The local interconnect 256 is connected to the pads 246 and 248.

Further, the local interconnect 251 is connected to the power supply line 211 through the contact 281*a*. The local interconnect 252 is connected to the power supply line 211 through the contact 281*b*. The local interconnect 253 is connected to the power supply line 212 through the contact 281*c*. The local interconnect 254 is connected to the power supply line 212 through the contact 281*d*.

In the M1 line layer, the lines 264 and 265 each extending in the Y-direction are formed. The line 264 is connected to the local interconnect 251 through the contact 283*a*, and connected to the local interconnect 252 through the contact 283*b*. The line 265 is connected to the local interconnect 253 through the contact 283*c*, and connected to the local interconnect 254 through the contact 283*d*.

Further, in the M2 line layer, the lines 271 and 272 each extending in the X-direction are formed. The line 271 is a line that supplies the power supply voltage VSS, and the line 272 is a line that supplies the power supply voltage VDD. The line 271 is connected to the line 264 via a contact 285*a* and is connected to the line 265 via a contact 285*b*. The line 272 is connected to the line 61 through a contact 285*c*.

With the above-described configuration, the line 271 formed in the M2 line layer of the well tap part C22 supplies the power supply voltage VSS to the power supply line 211 in the buried interconnect layer, through the contact 285*a*, the line 264, the contacts 283*a* (283*b*), the local interconnects 251 (252), and the contacts 281*a* (281*b*). Further, the line 271 supplies the power supply voltage VSS to the power supply line 212 in the buried interconnect layer, through the contact 285*b*, the line 265, the contacts 283*c* (283*d*), the local interconnects 253 (254), and the contacts 281*c* (281*d*). The power supply lines 211 (212) are connected to the power supply lines 11 (12) of the memory cell C1 through the power supply lines 111 (112). As a result, the power supply of the buried power rail can be strengthened without widening the line width of the buried power rail of the memory cell C1, and therefore an increase in the resistance of the power supply line can be suppressed.

Further, the line 271 supplies the power supply voltage VSS to the local interconnects 251 to 254 and the pads 241 to 244. Further, the P-type substrate 202 is formed below the pads 241 and 242, and the P-type substrate 203 is formed below the pads 243 and 244. The line 271 supplies the power supply voltage VSS to the P-type substrates 202 and 203 through the local interconnects 251 to 254 and the pads 241 to 244.

The line 272 supplies the power supply voltage VDD to the local interconnects 255 and 256 and to the pads 245 to 248. Further, the N-well 204 is formed below the pads 245 to 248. The line 271 supplies the power supply voltage VDD to the N-well 204 through the local interconnects 255 and 256 and the pads 245 to 248.

That is, by providing the well tap cell C2 in the circuit block, the potentials of the N-well 1 and the P-type substrates 2 and 3 of the memory cell C1 can be fixed.

(Layout Configuration of Circuit Block)

Figure 8:
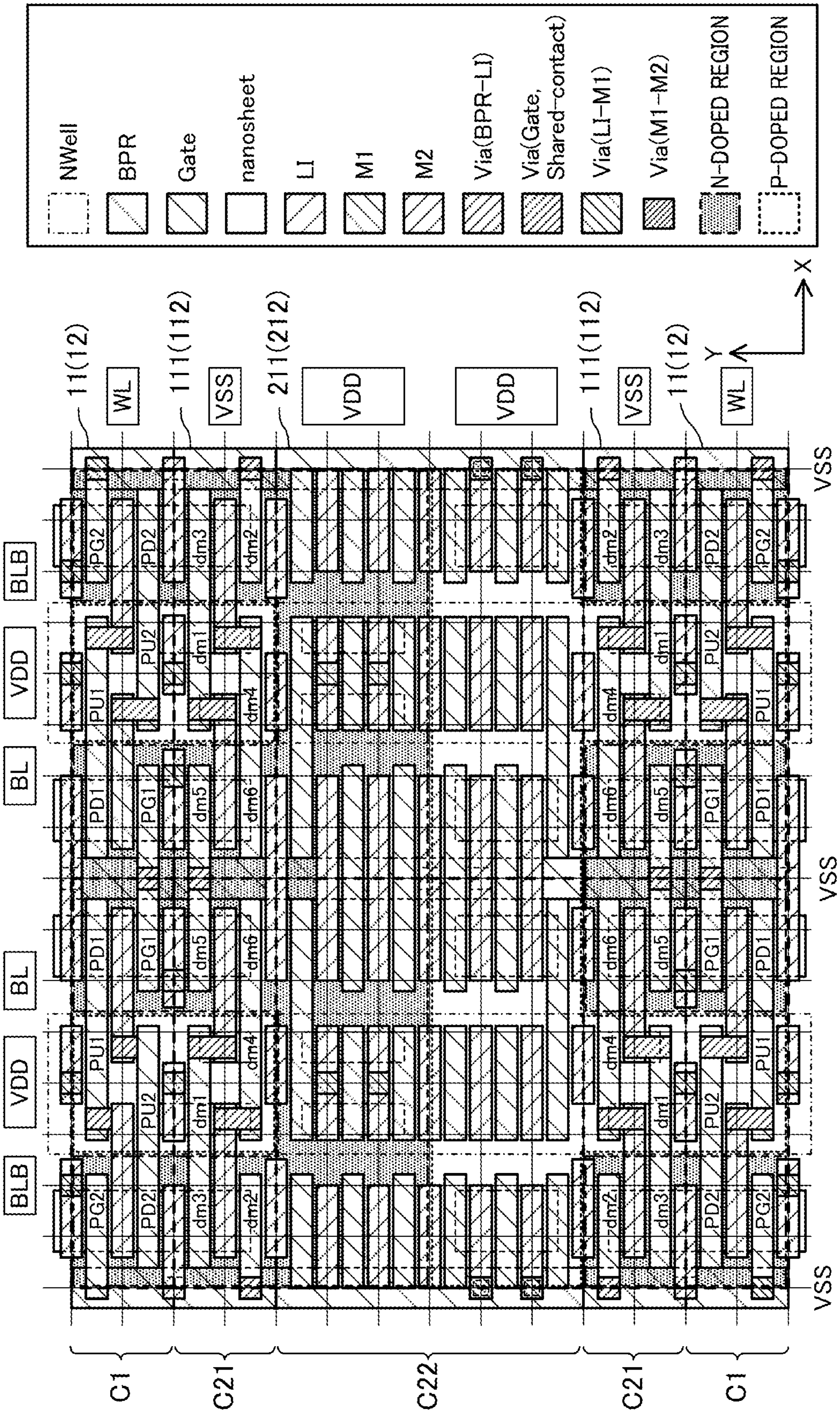
FIG. 8 is an enlarged view of a dotted line segment of the circuit block of FIG. 1.

FIG. 8 is an enlarged view of a dotted line segment of the circuit block of FIG. 1. FIG. 8 shows a layout configuration of the cell lower part, and schematically shows lines in the M1 and M2 line layers in the upper part and the right side of the drawing.

As shown in FIG. 8, the dummy memory cell part C21 is arranged so as to be adjacent to the memory cell C1 arranged in the Y-directional end part of the memory sub-array A1, and therefore manufacturing-attributed variations of the memory cell C1 can be suppressed.

By arranging the well tap cell C2 in the circuit block, the potentials of the N-well 1 and the P-type substrates 2 and 3 are fixed.

Further, since the power supply lines 11, 12, 111, 112, 211, and 212 formed in the buried interconnect layer and the lines 71, 171, and 271 formed in the M2 line layer are configured in a mesh in plan view, the power supply is strengthened.

Variation 1

(Layout Configuration of Circuit Block)

Figure 9:
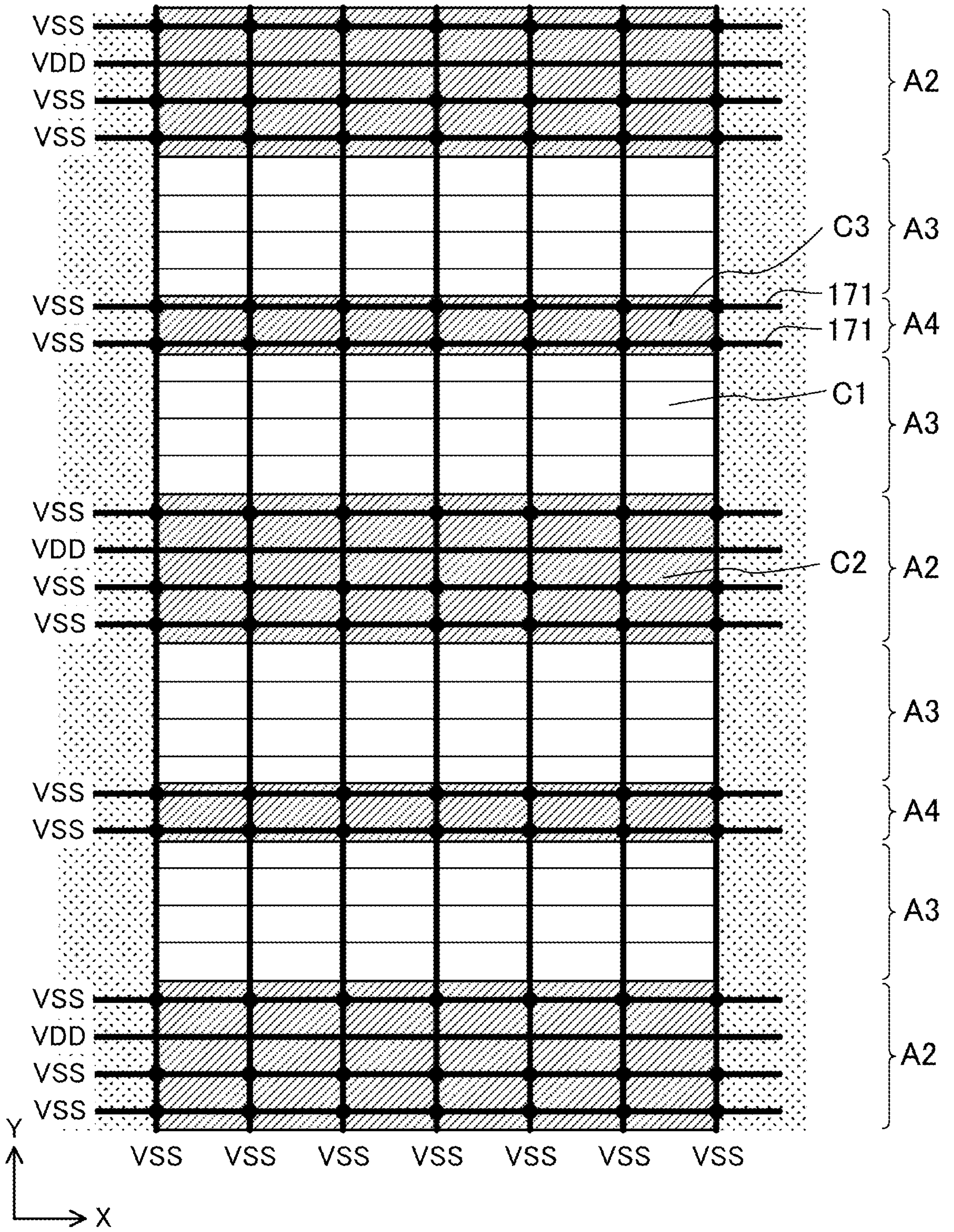
FIG. 9 is another exemplary layout configuration of the circuit block.

FIG. 9 shows another exemplary circuit block layout configuration of a semiconductor memory device related to the present embodiment. When compared to the configuration of FIG. 1, the configuration of FIG. 9 includes a BPR tap cell part A4 arranged between memory sub-arrays A3.

Specifically, the BPR tap cell part A4 is arranged between the memory sub-arrays A3. In each memory sub-array A3, there are six memory cells C1 arranged in the X-direction and four memory cells C1 in the Y-direction. In each memory sub-array A3, the memory cells C1 are arranged so as to be laterally inverted in the X-direction and vertically inverted in the Y-direction.

Further, each BPR tap cell part A4 includes BPR tap cells C3 arranged side by side in the X-direction.

(Configuration of BPR Tap Cell)

Figure 10:
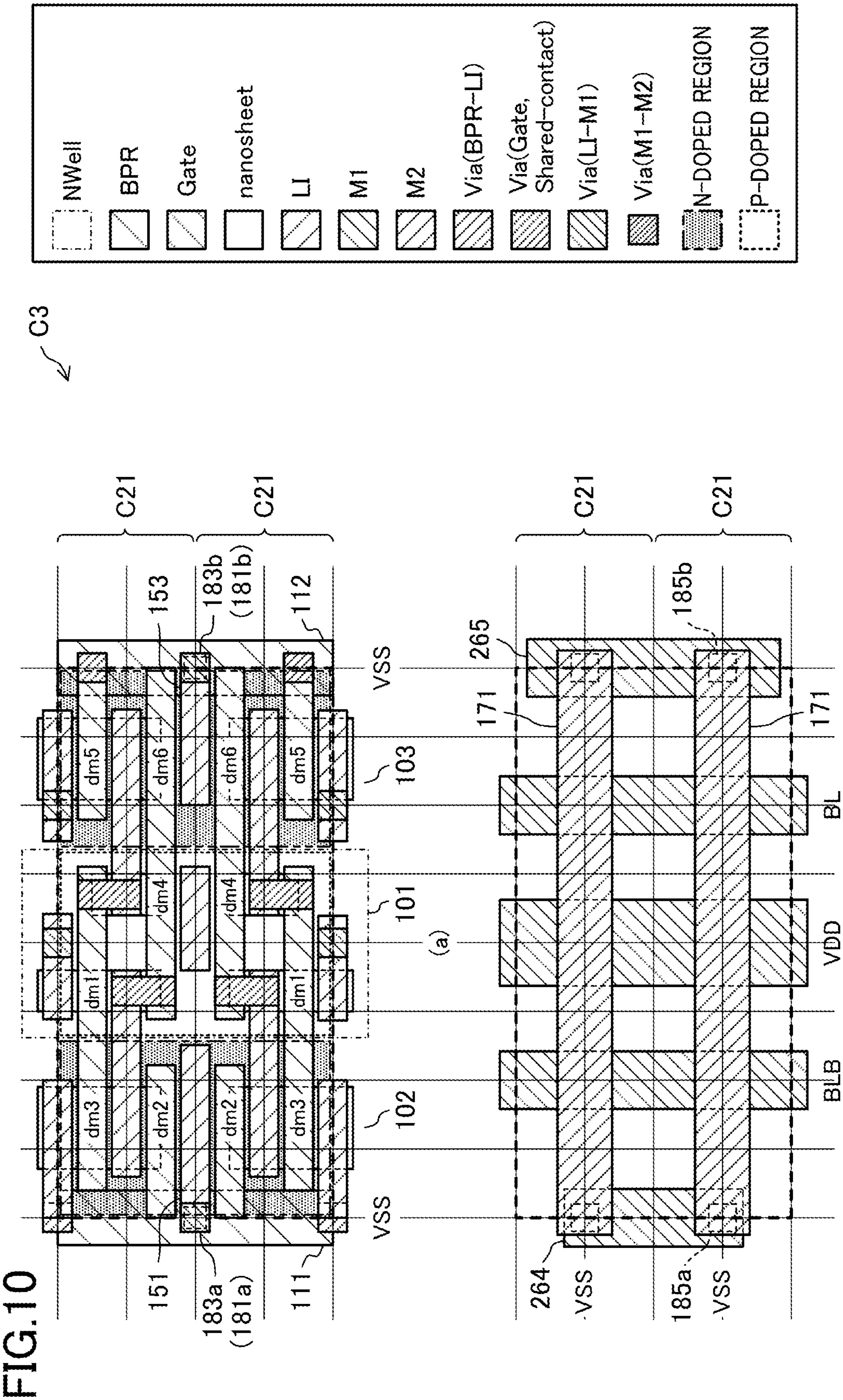
FIG. 10 is a plan view showing an exemplary layout configuration of a BPR tap cell C3, in which (a) shows a cell upper part and (b) shows a cell lower part.

FIG. 10 is a plan view showing an exemplary layout configuration of a BPR tap cell C3. Specifically, an illustration (a) of FIG. 10 shows a lower part of the cell, and an illustration (b) of FIG. 10 shows an upper part of the cell.

As shown in FIG. 10, the BPR tap cell C3 is the well tap cell C2 shown in FIGS. 6 and FIG. 7 from which the well tap part C22 is omitted.

Further, between the dummy memory cell parts C21, local interconnects 151 and 153 are formed. The local interconnect 151 is connected to the power supply line 111 through a contact 181*a* and is connected to the line 264 via a contact 183*a*. The local interconnect 153 is connected to the power supply line 112 through the contact 181*a* and is connected to the line 265 via the contact 183*a*. That is, the line 171 formed in the M2 line layer is connected to the power supply line 111 through the contact 185*a*, the line 264, the contact 183*a*, the local interconnect 151 and the contact 181*a*. Further, the line 171 is connected to the power supply line 112 through the contact 185*b*, the line 265, a contact 183*b*, the local interconnect 153 and the contact 181*b*. As a result, the power supply of the buried power rail of the memory cell C1 can be strengthened, and therefore an increase in the resistance of the power supply line can be suppressed.

In a transistor, such as a nanosheet FET, having a three-dimensional structure, there is little substrate bias effect, and the substrate potential hardly affects the transistor characteristic. Therefore, the arrangement interval of the well tap cell parts A2 can be increased. On the other hand, it is preferable to reduce the intervals of the lines for strengthening the power supply in consideration of an increase in the resistance of the power supply lines attributed to miniaturization. Therefore, inserting the BPR tap cell part A4 in addition to the well tap cell part A2 with respect to the memory sub-array as in the present variation brings about the above effect while suppressing an increase in the area of the semiconductor memory device.

Variation 2

(Layout Configuration of Circuit Block)

Figure 11:
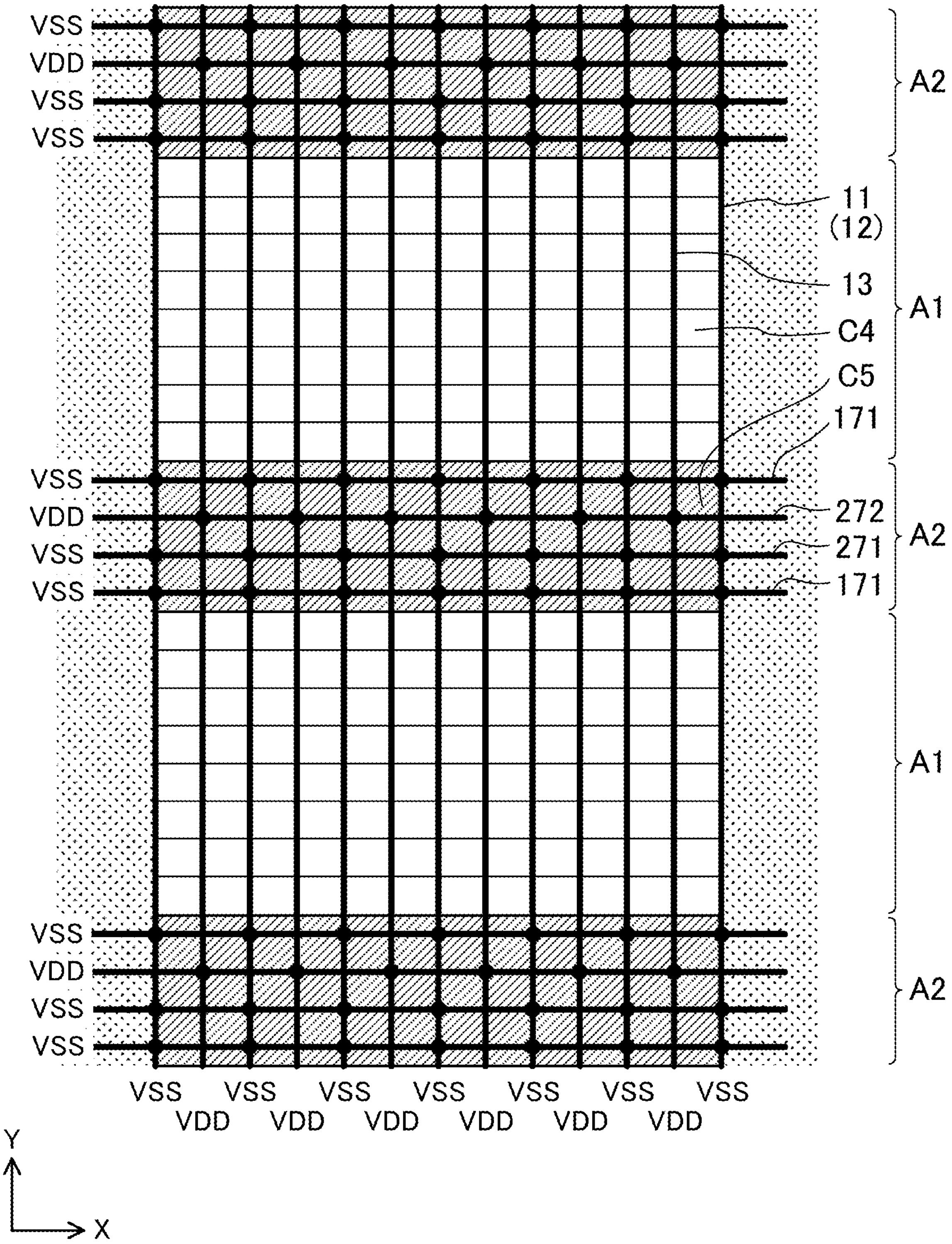
FIG. 11 is another exemplary layout configuration of the circuit block.

FIG. 11 shows another exemplary circuit block layout configuration of a semiconductor memory device related to the embodiment. FIG. 11 is different from FIG. 1 in that a power supply line 13 that supplies the power supply voltage VDD is formed between the power supply lines 11 (12) that supply the power supply voltage VSS, in the buried interconnect layer.

Each memory sub-array A1 shown in FIG. 11 includes memory cells C4 in place of the memory cells C1. Further, well tap cells C5 are arranged in place of the well tap cells C2 in each of the well tap cell parts A2.

As will be described in detail later, the line 272 of the M2 line layer, which supplies the power supply voltage VDD, is connected to the power supply line 13, in FIG. 11. Since the line 272 allows strengthening of the power supply of the power supply line 13, an increase in the resistance of the power supply line can be suppressed while using the buried power rail as the power supply line.

(Layout Configuration of Memory Cell)

Figure 12:
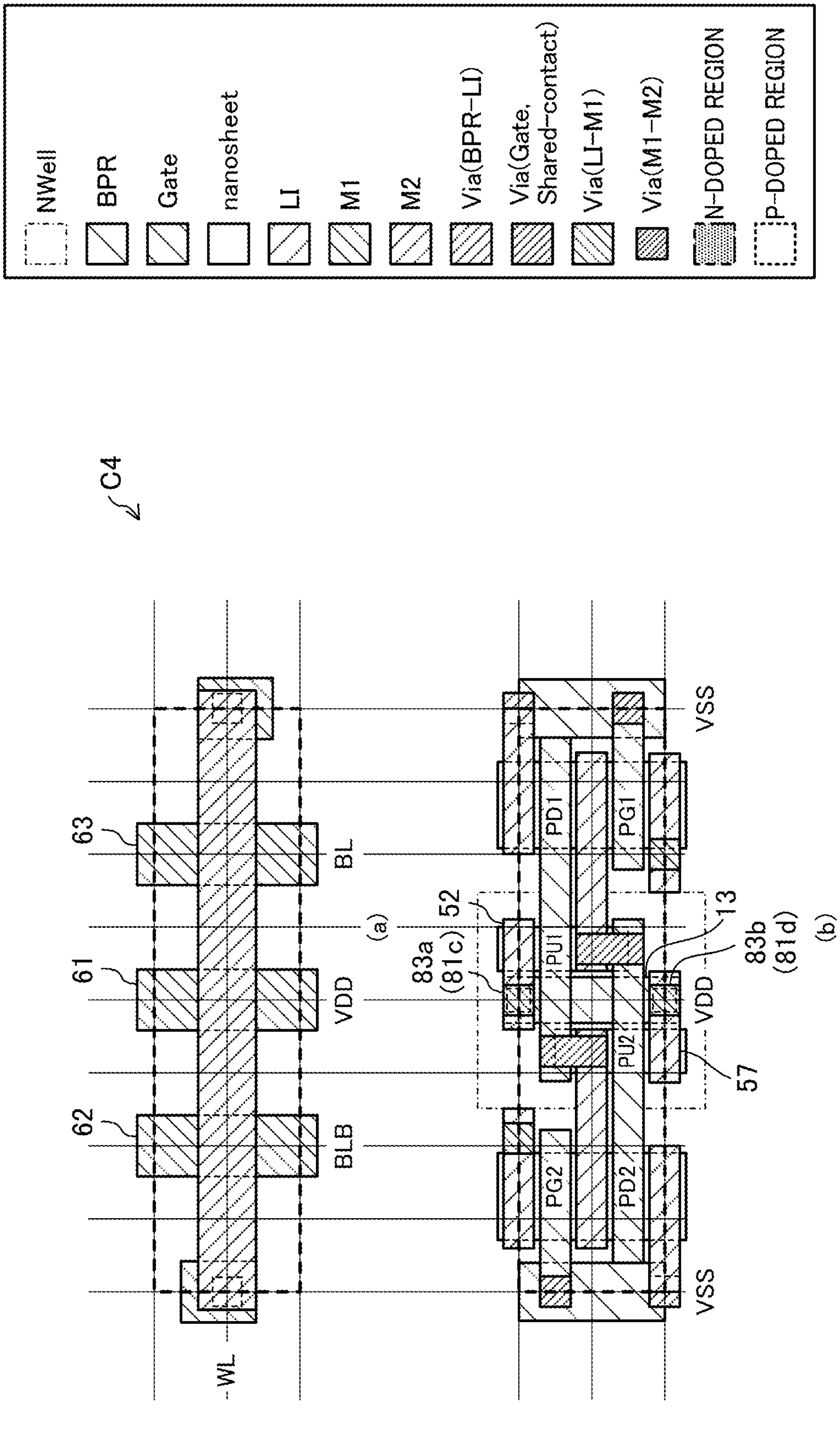
FIG. 12 is a plan view showing an exemplary layout configuration of a memory cell C4, in which (a) shows a cell upper part and (b) shows a cell lower part.

FIG. 12 is a plan view showing an exemplary layout configuration of a memory cell C4. An illustration (a) of FIG. 12 shows an upper part of the cell, and an illustration (b) of FIG. 12 shows a lower part of the cell.

In the memory cell C4 of FIG. 12, the power supply line 13 extending in the Y-direction is formed in the middle of the cell in the buried interconnect layer, as compared with FIG. 3. The power supply line 13 supplies the power supply voltage VDD. The power supply line 13 is connected to the local interconnect 52 through a contact 81*c*, and connected to the local interconnect 57 through a contact 81*d*.

Since the power supply line 13 is configured in the buried interconnect layer in FIG. 12, the line width of the line (line 61) that supplies the power supply voltage VDD to the M1 line layer can be narrowed. Therefore, the intervals between the line 61 and the lines 62 and 63 (bit lines BLB and BL) can be widened, and the parasitic capacitance can be suppressed. This way, the speed of the memory cell C4 can be increased. Further, since the line width of the lines 62 and 63 (bit lines BLB and BL) can be widened and the line resistance of the lines 62 and 63 can be suppressed, the speed of the memory cell C4 can be increased.

It should be noted that the line 61 of the M1 line layer can be omitted if the power supply line 13 alone can sufficiently ensure capability of supplying the power supply voltage VDD to the memory cell C4.

(Layout Configuration of Well Tap Cell)

Figure 13:
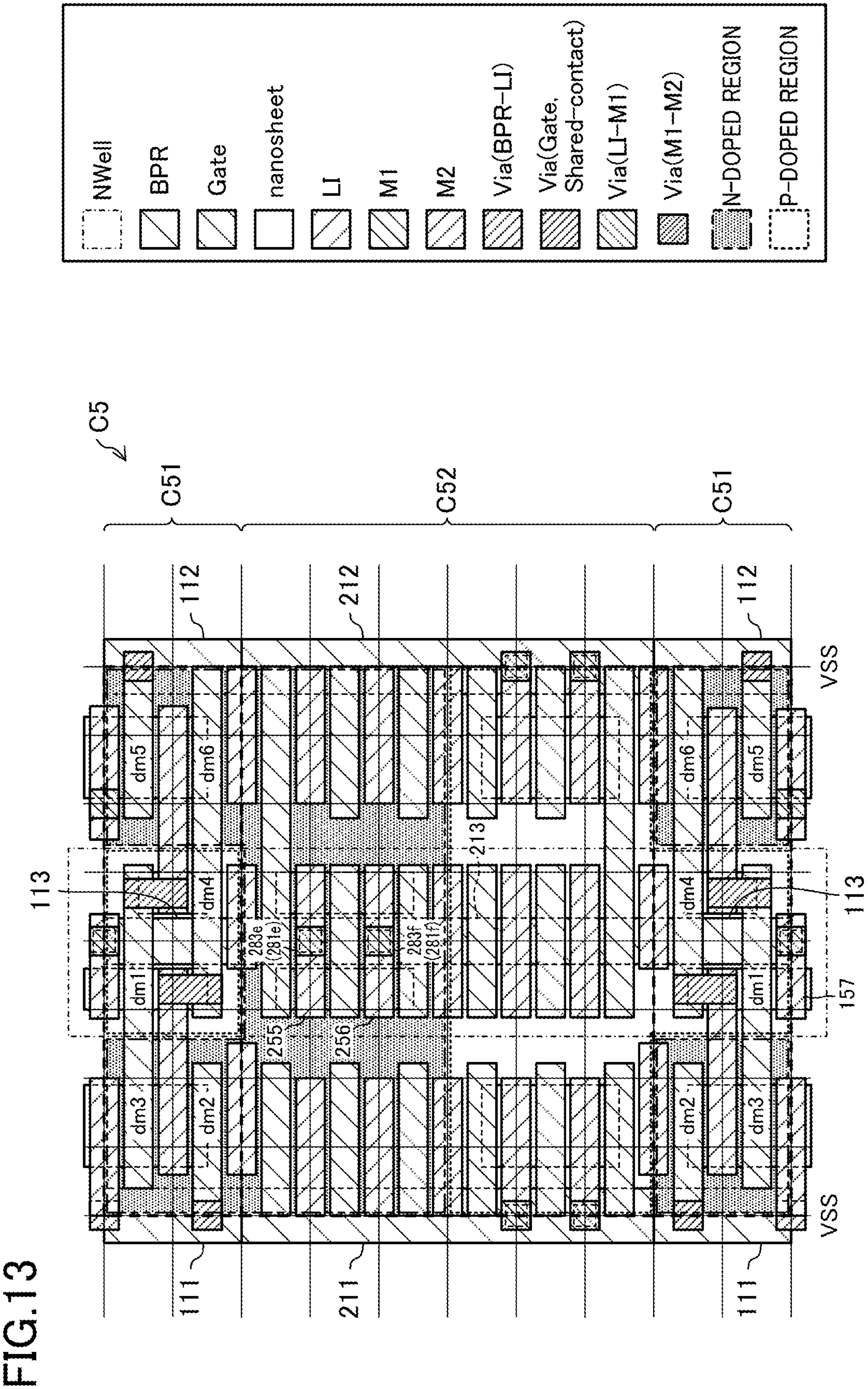
FIG. 13 is a plan view showing an exemplary layout configuration of a well tap cell C5.
Figure 14:
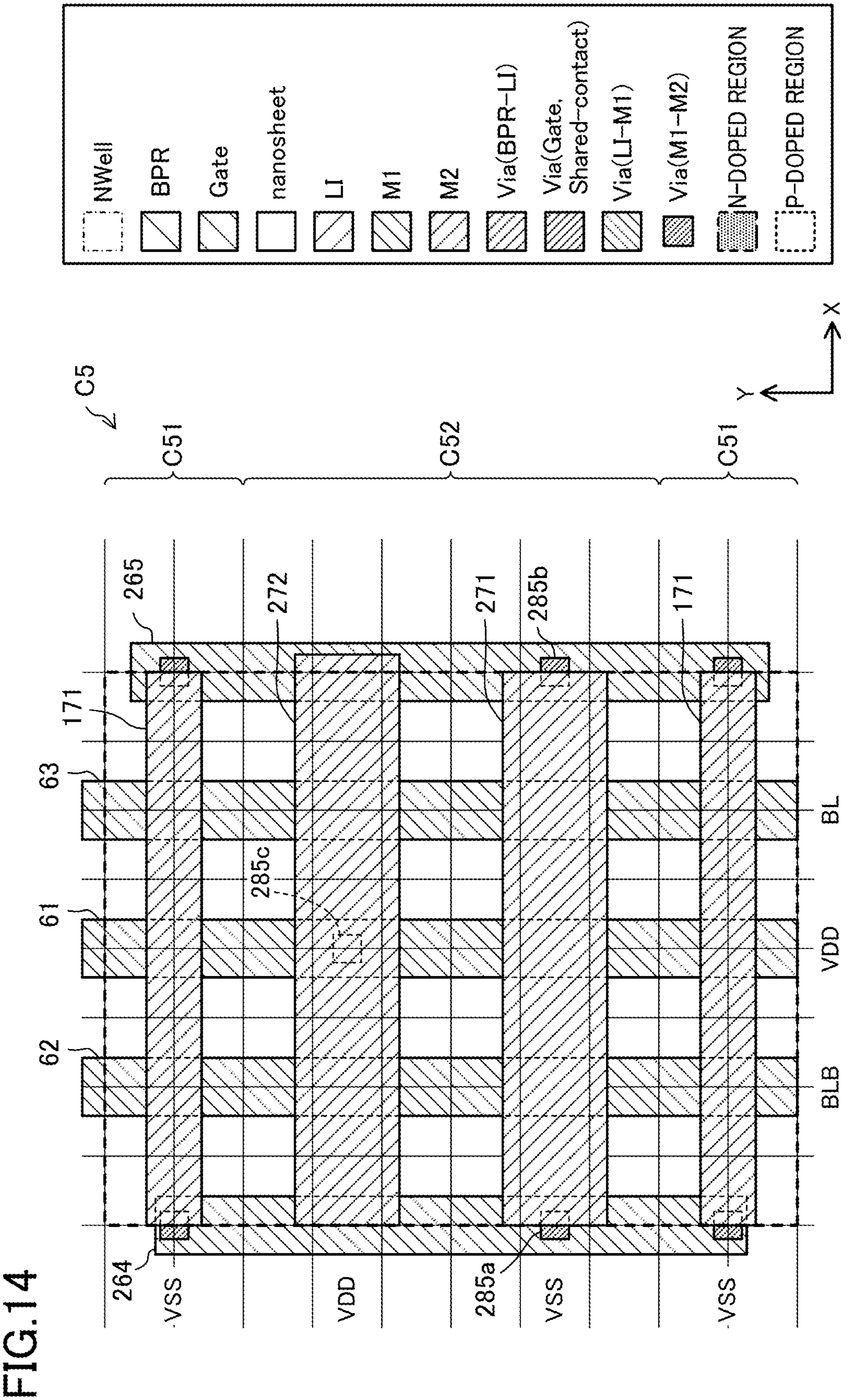
FIG. 14 is a plan view showing an exemplary layout configuration of the well tap cell C5.

FIG. 13 and FIG. 14 are each a plan view showing an exemplary layout configuration of the well tap cell C5. Specifically, FIG. 13 shows the cell lower part and FIG. 14 shows the cell upper part.

In the well tap cell C5 of FIG. 13, a buried power rail extending in the Y-direction is formed in the middle of the cell in the buried interconnect layer, as compared with FIG. 6. Specifically, a power supply line 113 is formed in the dummy memory cell part C51 of the well tap cell C5, and the power supply line 213 is formed in the well tap part C52. The power supply line 213 is connected to the power supply line 13 of the memory cell C4 through the power supply line 113.

Further, in the well tap part C52, the power supply line 213 is connected to the local interconnect 255 through a contact 281*e*, and connected to the local interconnect 256 through a contact 281*f* As described above, the local interconnects 255 and 256 are connected to the line 272 of the M2 line layer. That is, the line 272 is connected to the power supply line 13 of the memory cell C4 through the power supply lines 213 and 113. Thus, since the line 272 formed in M2 line layer, which supplies the power supply voltage VDD, supplies the power supply voltage VDD to the power supply line 13 of the memory cell C4, the power supply of the power supply line 13 can be strengthened.

(BPR Tap Cell)

Figure 15:
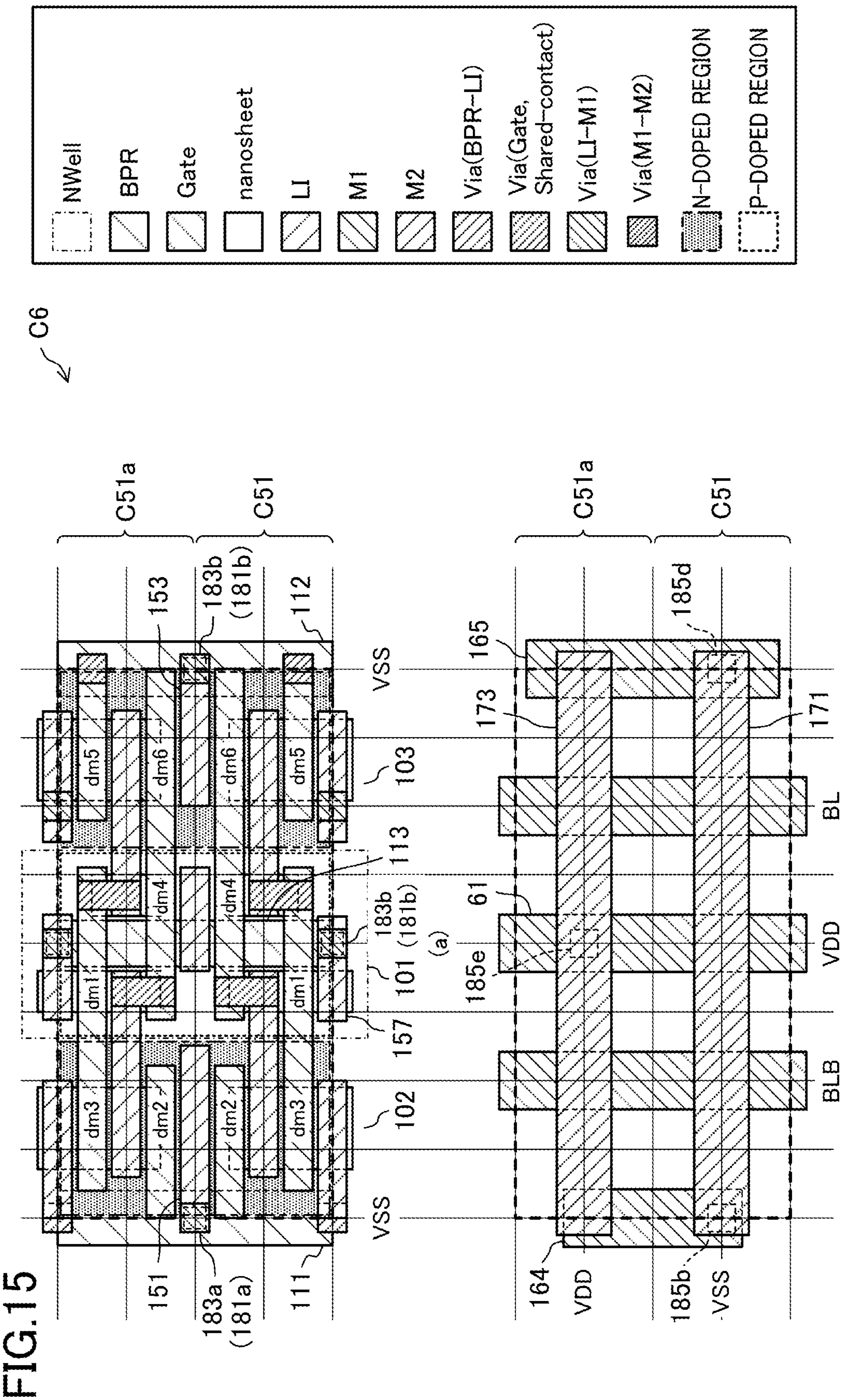
FIG. 15 is a plan view showing another exemplary layout configuration of a BPR tap cell C6, in which (a) shows a cell upper part and (b) shows a cell lower part.

FIG. 15 is a plan view showing an exemplary layout configuration of a BPR tap cell C6. Specifically, an illustration (a) of FIG. 15 shows a lower part of the cell, and an illustration (b) of FIG. 15 shows an upper part of the cell.

As shown in FIG. 15, the BPR tap cell C6 is the well tap cell C2 shown in FIG. 13 and FIG. 14 from which the well tap part C52 is omitted, and is substantially the same as the BPR tap cell in FIG. 10.

Specifically, in the BPR tap cell C6, the power supply line 113 extending in the Y-direction is formed in the buried interconnect layer, at the center of the drawing. Further, in the dummy memory cell part C51*a* in the upper part of the drawing, a line 173 that supplies the power supply voltage VDD is formed, in place of the line 171, in the M2 line layer. The line 173 is connected to the line 61 through a contact 185*e*. As described above, the line 61 is connected to the power supply line 113 through the contact 183*b*, the local interconnect 157 and the contact 181*b*. That is, the line 173 is connected to the power supply line 113.

Arranging the BPR tap cell C6 of FIG. 15 in the circuit block brings about the same effect as that brought about by the configuration of FIG. 10. Further, with the line 173 in the M2 line layer, the power supply of the power supply line 13 in the memory cell C4 can be strengthened.

Variation 3

Figure 16:
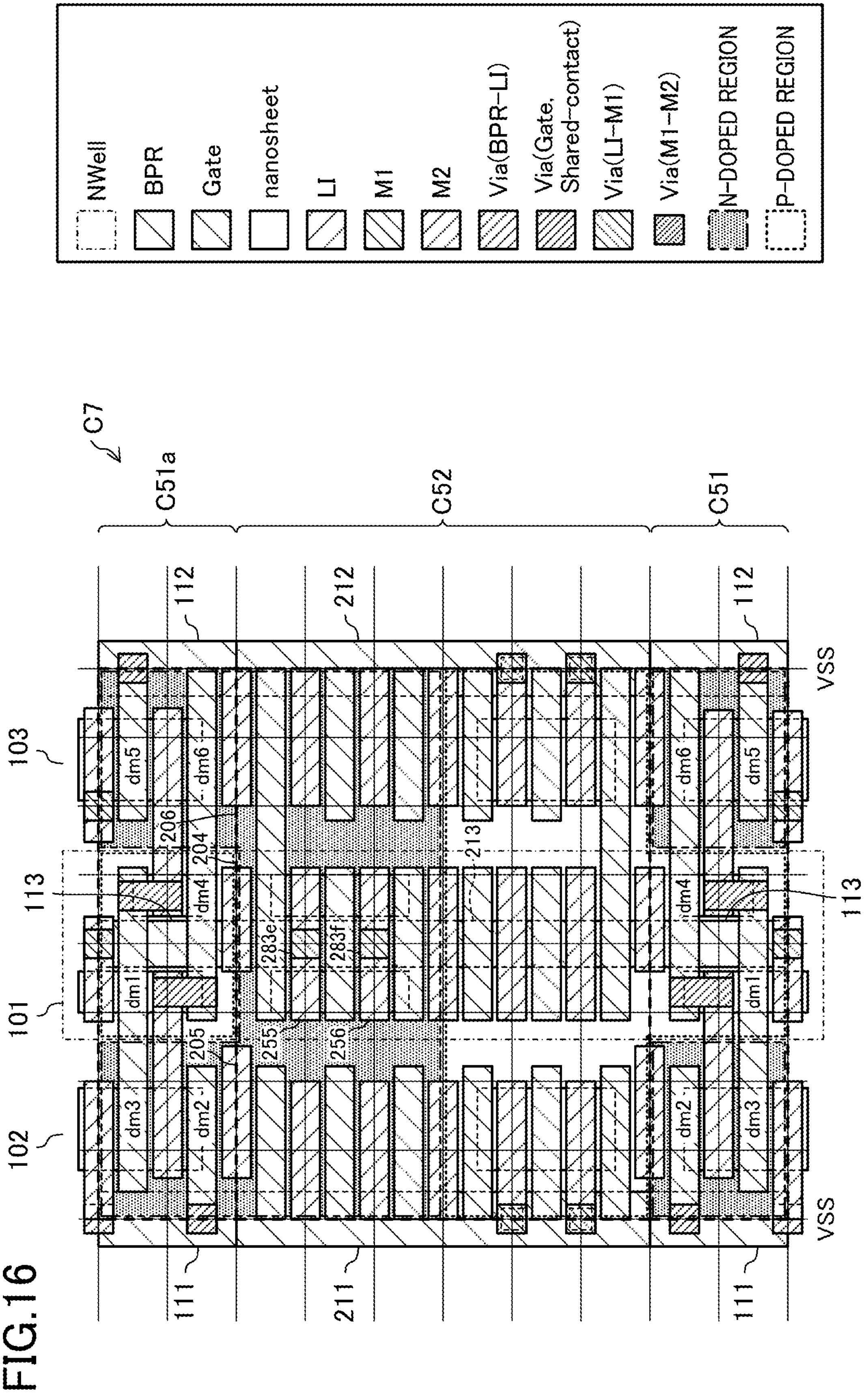
FIG. 16 is a plan view showing an exemplary layout configuration of a well tap cell C7.
Figure 17:
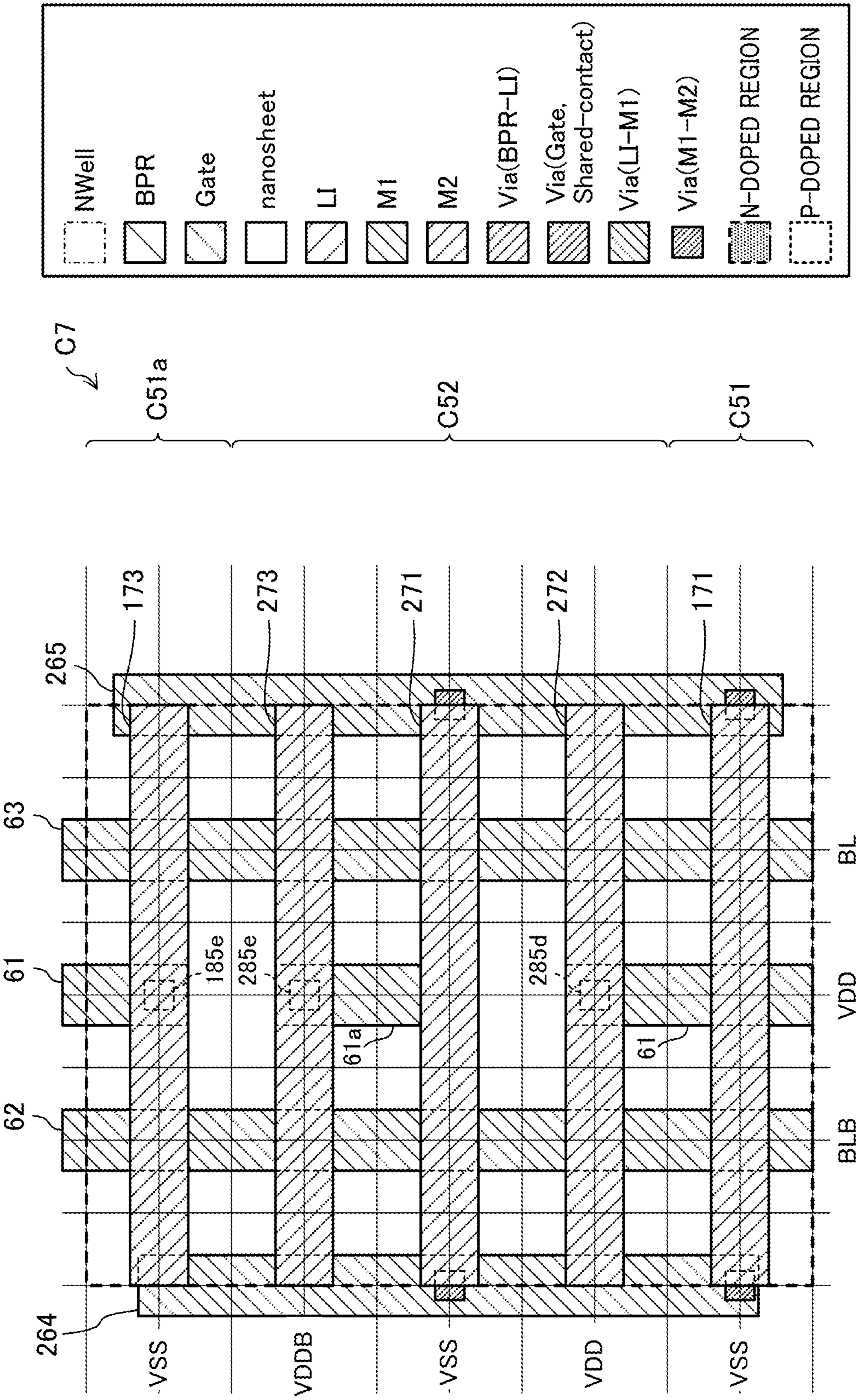
FIG. 17 is a plan view showing an exemplary layout configuration of the well tap cell C7.

FIG. 16 and FIG. 17 are each a plan view showing an exemplary layout configuration of the well tap cell C7. The well tap cell C7 shown in FIG. 16 and FIG. 17 is different from that shown in FIG. 13 and FIG. 14 in that contacts 281*e* and 281*f* that connects the power supply line 13 with the local interconnects 255 and 256, respectively are not formed. That is, the local interconnects 255 and 256 are not connected to the power supply line 213.

Further, in place of the dummy memory cell part C51 in the upper part of the drawing, a dummy memory cell part C51*a* is arranged in the upper part of the drawing.

Further, a line 273 that supplies a power supply voltage VDDB is formed in the M2 line layer. The line 273 is connected to a line 61*a* of the M1 line layer through a contact 285*e*. In FIG. 17, the line 61 in the upper part of the drawing and the line 61 in the lower part of the drawing are separated and the line 61*a* is formed therebetween. The line 61*a* is connected to the local interconnect 255 through a contact 283*e*, and connected to the local interconnect 256 through a contact 283*f* That is, the line 273 supplies the power supply voltage VDDB to the local interconnects 255 and 256. Since the power supply voltage VDDB is supplied to the N-well 204 through the local interconnects 255 and 256, the power supply voltage VDDB is supplied to the N-well 1 of the memory cell C4. Thus, the voltage (power supply voltage VDD) applied to the sources of the load transistors PU1 and PU2 and the voltage (power supply voltage VDDB) supplied to the N-well 1 can be differentiated from each other. Therefore, it is possible to cope with a case where the circuit block has a power supply control function and where the power supply voltages VDD and VDDB are different from each other.

Further, the well tap cell C7 brings about an effect similar to that brought about by the configuration shown in FIG. 13 and FIG. 14.

Variation 4

(Circuit Configuration of Memory Cell)

Figure 18:
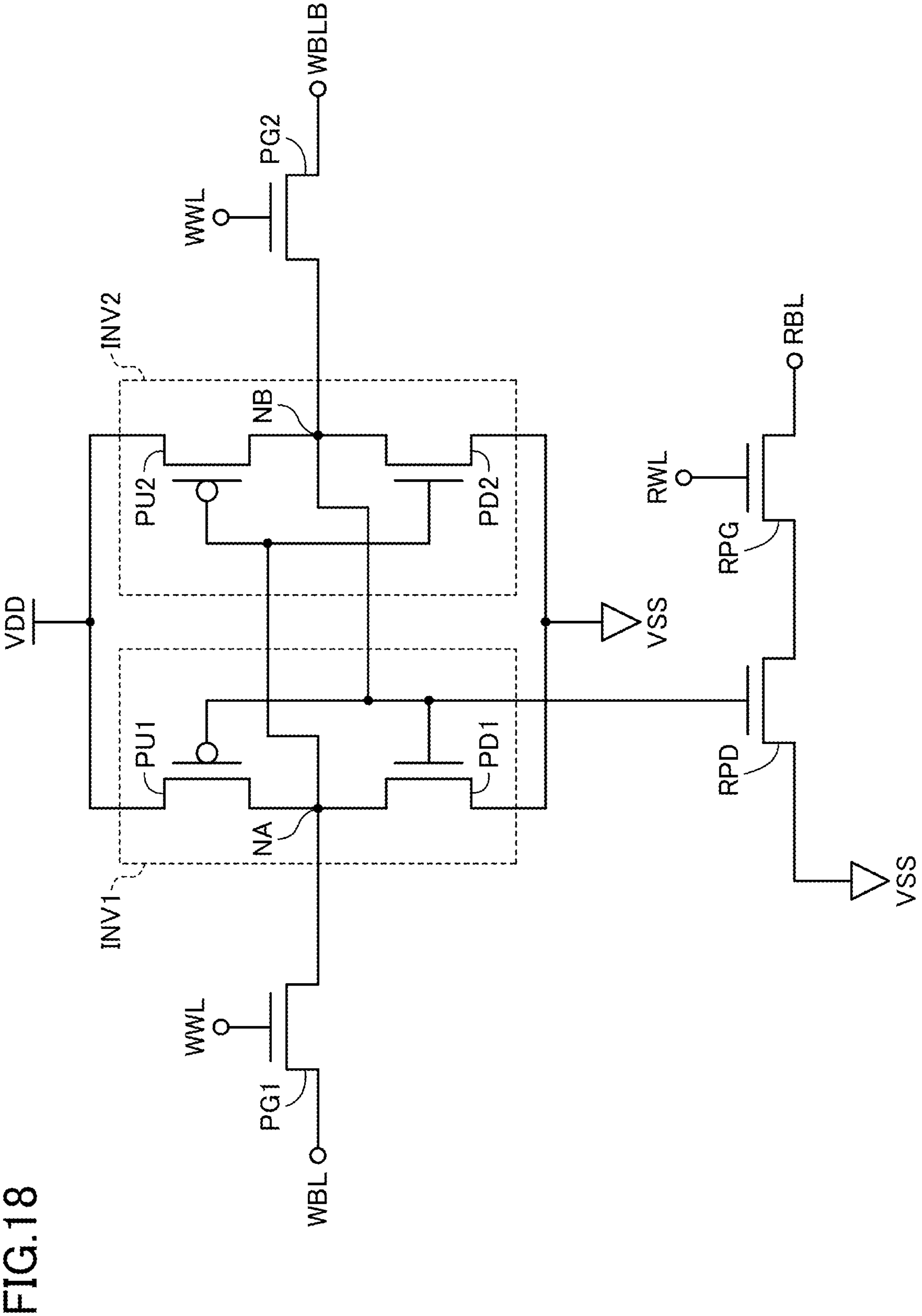
FIG. 18 is a circuit diagram showing a configuration of a memory cell C8.

FIG. 18 is a circuit diagram showing a configuration of a memory cell C8. In the memory cell C8, a 2-port memory cell circuit including load transistors PU1 and PU2, drive transistors PD1 and PD2, access transistors PG1 and PG2, a read drive transistor RPD, and a read access transistor RPG is configured as shown in FIG. 18. The load transistors PU1 and PU2 are each a P-type FET, and the drive transistors PD1 and PD2, the access transistors PG1 and PG2, the read drive transistor RPD, and the read access transistor RPG are each an N-type FET.

The load transistor PU1 is provided between a power supply voltage VDD and a first node NA, and the drive transistor PD1 is provided between the first node NA and the power source VSS. The load transistor PU1 and the drive transistor PD1 have their gates connected to a second node NB to configure an inverter INV1. The load transistor PU2 is provided between the power supply voltage VDD and the second node NB, and the drive transistor PD2 is provided between the second node NB and the power source VSS. The load transistor PU2 and the drive transistor PD2 have their gates connected to the first node NA to configure an inverter INV2. That is, an output of one of the inverters is connected to an input of the other inverter, thereby configuring a latch.

The access transistor PG1 is provided between a write-bit line WBL and the first node NA, and the gate thereof is connected to a write-word line WWL. The access transistor PG2 is provided between a write-bit line WBLB and the second node NB, and the gate thereof is connected to a write-word line WWL. The write-bit lines WBL and WBLB configure a complementary write-bit line pair.

The read drive transistor RPD has its source connected to the power source VSS, its gate to the second node NB, and the drain to the source of the read access transistor RPG. The read access transistor RPG has its gate connected to a read-word line RWL and its drain to a read-bit line RBL.

In the memory cell circuit of FIG. 18, while the write-bit lines WBL and WBLB constituting the complementary write-bit line pair are driven to a high level and a low level, respectively, driving the write-word line WWL to the high level causes the high level to be written to the first node NA and the low level to the second node NB. On the other hand, while the write-bit lines WBL and WBLB are driven to a low level and a high level, respectively, driving the write-word line WWL to the high level causes the low level to be written to the first node NA and the high level to the second node NB. Then, while data is written to the first and the second nodes NA and NB, driving the write-word line WWL to the low level determines a latch state and retains the data written to the first and the second nodes NA and NB.

Further, with the read-bit line RBL is pre-charged in advance to the high level, driving the read-word line RWL to the high level determines the state of the read-bit line RBL according to the data written to the second node NB, and data can be read out from the memory cell. Specifically, when the second node NB is at the high level, the read-bit line RBL is discharged to the low level. On the other hand, when the second node NB is at the low level, the read-bit line RBL maintains the high level.

As described above, the memory cell has a function of writing and retaining data to and in the memory cell, and reading out data from the memory cell, by controlling the write-bit lines WBL and WBLB, the read-bit line RBL, the write-word line WWL, and the read-word line RWL.

(Layout Configuration of Memory Cell)

Figure 19:
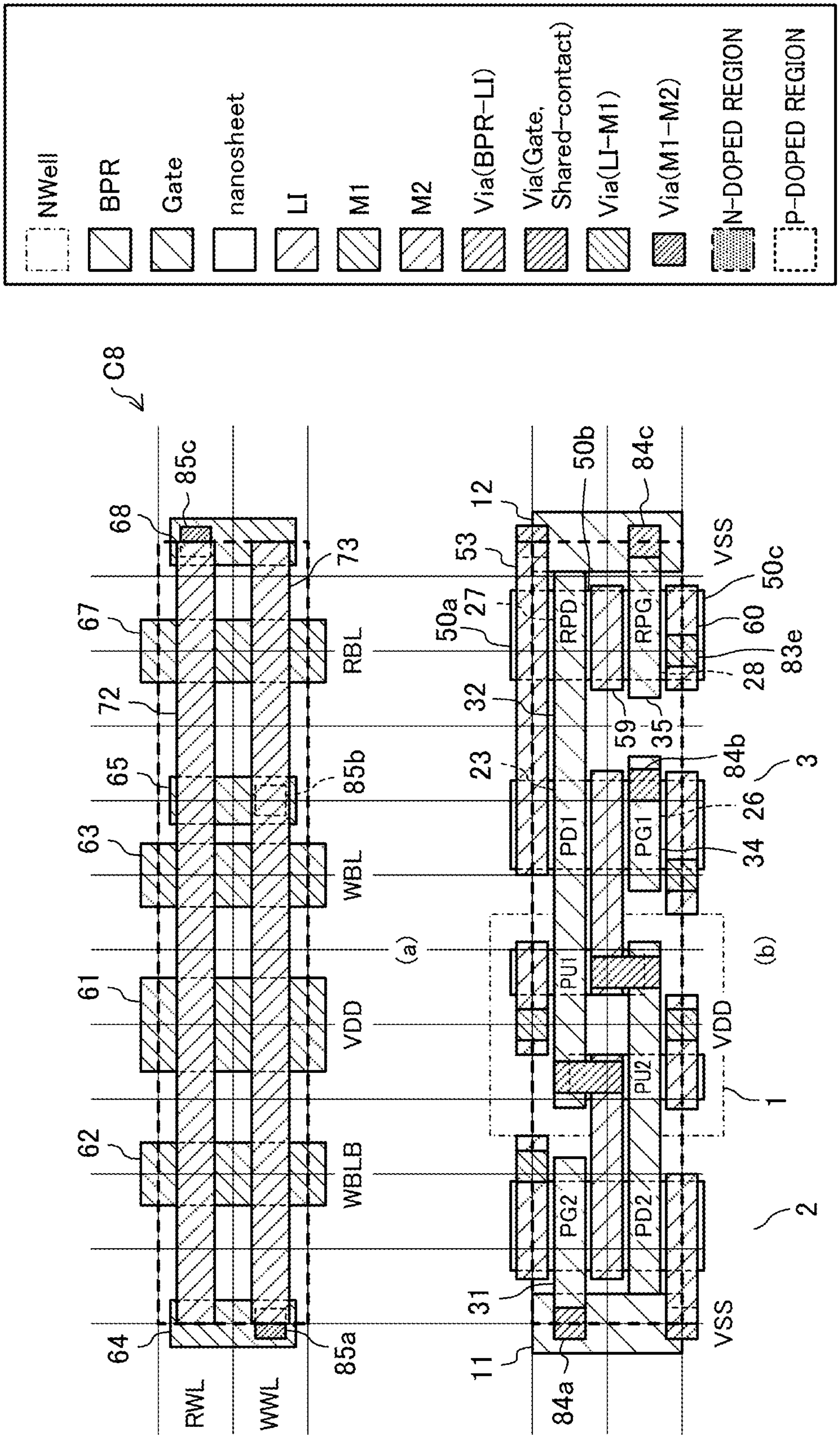
FIG. 19 is a plan view showing an exemplary layout configuration of the memory cell C8, in which (a) shows a cell upper part and (b) shows a cell lower part.

FIG. 19 is a plan view showing an exemplary layout configuration of a memory cell C8. An illustration (a) of FIG. 19 shows an upper part of the cell, and an illustration (b) of FIG. 19 shows a lower part of the cell.

The memory cell C8 of FIG. 19 is different from FIG. 3 in that the read drive transistor RPD and the read access transistor RPG are formed on the right side of the drawing. Specifically, as shown in FIG. 19, nanosheets 27 and 28 are formed on the right side of the nanosheets 23 and 26 in the drawing, respectively. The nanosheets 27 and 28 constitute channel parts of the read drive transistor RPD and the read access transistor RPG, respectively.

The gate line 35 extending in the X-direction and the Y-direction is formed on the right side of the gate line 34 in the drawing. The gate line 32 serves as the gate of the read drive transistor RPD and the gate line 35 serves as the gate of the read access transistor RPG.

Pads to 50*a* to 50*c* doped with an N-type impurity are formed at the upper end of the nanosheet 27 in the drawing, between the nanosheets 27 and 28, and the lower end of the nanosheet 28 in the drawing, respectively. The pads 50*a* and 50*b* constitute a node of the read drive transistor RPD. The pads 50*b* and 50*c* constitute a node of the read access transistor RPG.

In the local interconnect layer, local interconnects 59 and 60 extending in the X-direction are formed. The local interconnects 53 is connected to the pad 50*a*. The local interconnects 59 is connected to the pad 50*b*. The local interconnects 60 is connected to the pad 50*c*.

In the M1 line layer, a line 67 corresponding to the read-bit line RBL is formed. The line 67 is connected to the local interconnect 60 through a contact 83*e*. It should be noted that, in FIG. 19, the line 62 corresponds to the write-bit line WBLB, and that the line 63 corresponds to the write-bit line WBL.

In the M2 line layer, lines 72 and 73 each extending in the X-direction are formed. The line 72 corresponds to the read-word line RWL, and the line 73 corresponds to the write-word line WWL. The line 72 is connected to the gate line 35 through a contact 85*c*, a line 68, and a contact 84*c*. The line 73 is connected to the gate line 31 through the contact 85*a*, the line 64, and the contact 84*a*. Further, the line 73 is connected to the gate line 34 through the contact 85*b*, a line 65, and the contact 84*b*.

(Layout Configuration of Well Tap Cell)

Figure 20:
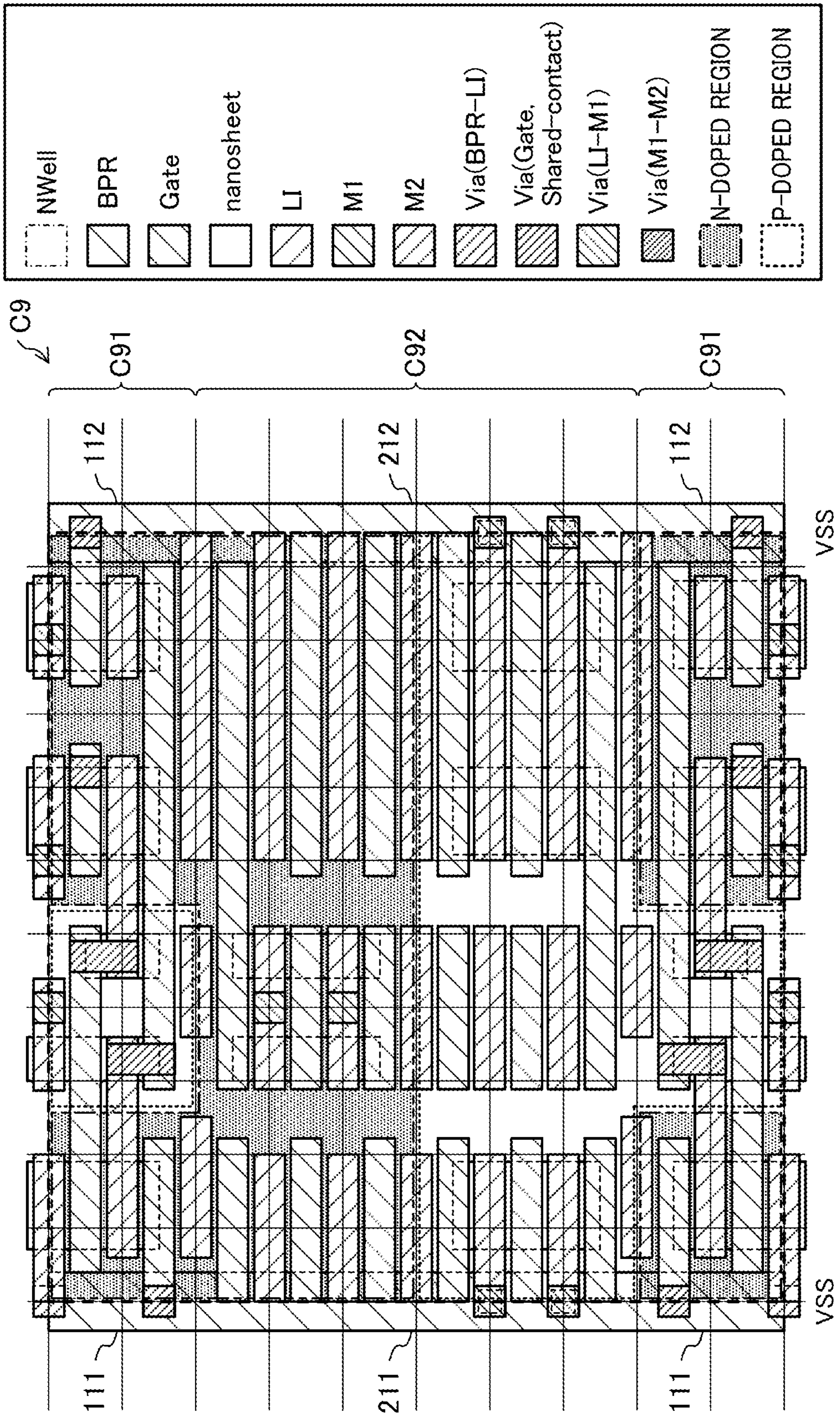
FIG. 20 is a plan view showing another exemplary layout configuration of a well tap cell C9.
Figure 21:
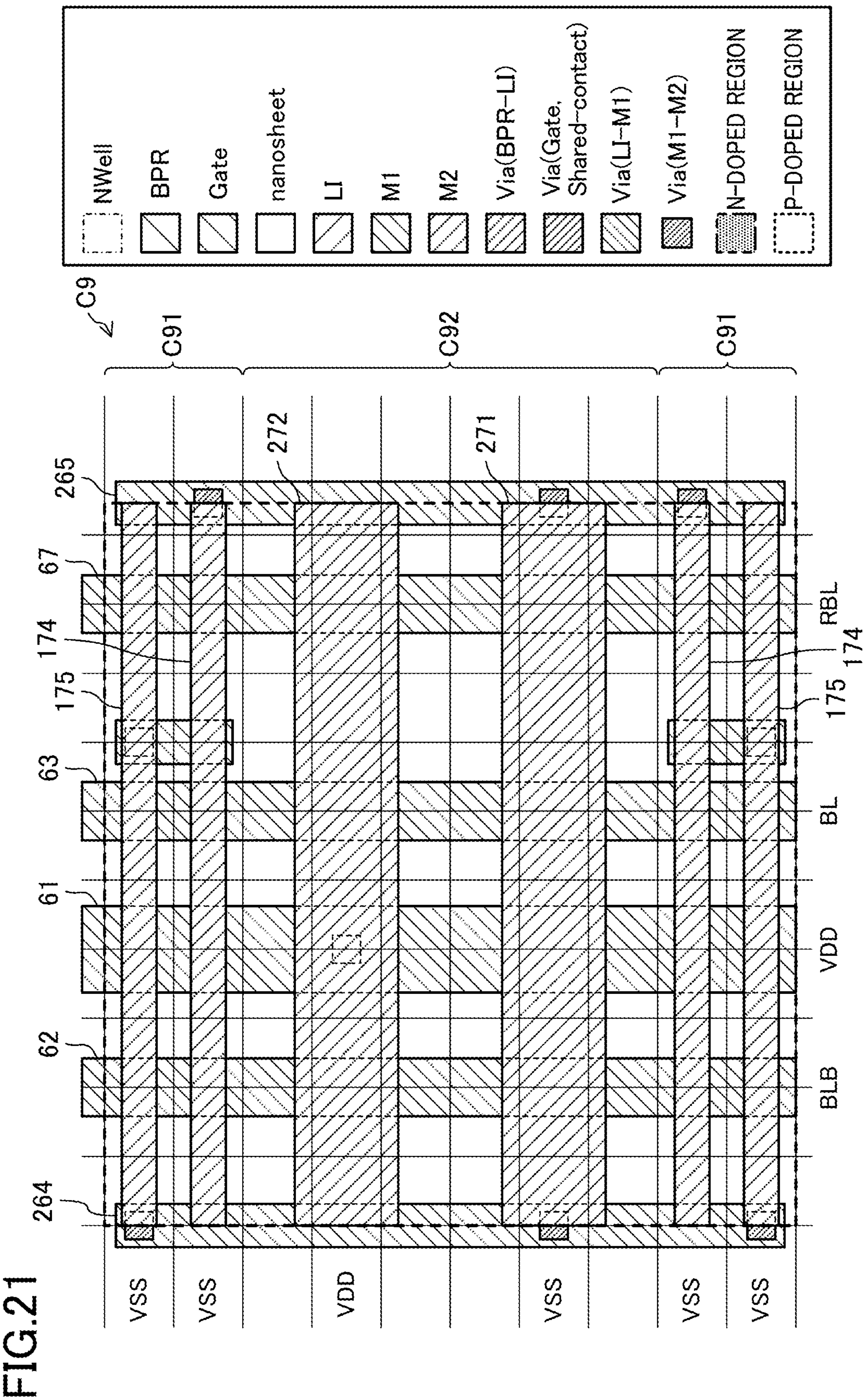
FIG. 21 is a plan view showing another exemplary layout configuration of the well tap cell C9.

FIG. 20 and FIG. 21 are each a plan view showing an exemplary layout configuration of the well tap cell C9. Specifically, FIG. 20 shows the cell lower part, and FIG. 21 shows the cell upper part.

The well tap cell C9 shown in FIG. 20 and FIG. 21 is configured substantially similarly to the well tap cell C2 shown in FIG. 6 and FIG. 7. Specifically, the well tap cell C9 includes dummy memory cell parts C91 arranged at the upper part and the lower part of the drawing and a well tap part C92 arranged in the middle of the drawing.

The dummy memory cell parts C91 each have a substantially similar layout configuration as that of the memory cell C8; however, the transistors therein are dummy transistors having no logic function. The arrangement of the dummy memory cell part C91 in the upper part of the drawing is inversion of the dummy memory cell part C91 arranged in the lower part of the figure in the Y-direction.

Further, in the dummy memory cell part C91, lines 174 and 175 are arranged in place of the line 171 in the M2 line layer. The lines 174 and 175 each supply the power supply voltage VSS. In other words, the lines 174 and 175 arranged in the M2 line layer of the dummy memory cell part C91 are connected to the power supply lines 11 (12) of the memory cell C8 through the power supply lines 111 (112), respectively.

Further, the well tap part C92 has a configuration that is substantially the same as that of the well tap part C22 shown in FIG. 6 and FIG. 7, and strengthens the buried power rail of the memory cell C8 and fixes the potentials of the N-well 1 and the P-type substrates 2 and 3 of the memory cell C8.

The well tap cell C9 brings about an effect similar to that brought about by the well tap cell C2.

Although a detailed description is omitted, the well tap cell C9 can be modified to have a configuration similar to those of the variations 1 and 2.

The above-described embodiment deals with a case where transistors formed in each cell are each a nanosheet FET; however, the transistors are not limited thereto and may be for example, a fin-type transistor. Further, the embodiment deals with a case where the nanosheet FETs of each cell each include three nanosheets; however, the number of nanosheets is not limited to three.

Further, in the memory sub-array A1, memory cells are arranged in an array with six cells in the X-direction and eight cells in the Y-direction; however, the number of memory cells arranged in an array is not limited thereto. The same applies to the number of memory cells arranged in the memory sub-array A3.

Regarding a semiconductor memory device using a buried power rail, the present disclosure allows suppression of an increase in the resistance of the buried power rail, and hence is useful for improving the performance of a semiconductor chip, for example.

What is claimed is:

1. A semiconductor memory device, comprising:

first and second memory sub-arrays arranged side by side in a first direction; and a plurality of well tap cells arranged between the first and second memory arrays and arranged side by side in a second direction perpendicular to the first direction in plan view, wherein the first and second memory sub-arrays each include a plurality of memory cells arranged in an array, and a first power rail formed in a first interconnect layer, extending in the first direction, and configured to supply a first power supply voltage, the first interconnect layer being an interconnect layer below transistors formed in the memory cells, the first power rail overlapping with a boundary between two adjacent memory cells of the plurality of memory cells, wherein:

the well tap cells include:

a second power rail formed in the first interconnect layer, extending in the first direction, electrically connected to the first power rail, and configured to supply the first power supply voltage, and a first line formed in a second interconnect layer that is above the first interconnect layer, the first line extending in the second direction, electrically connected to the second power rail, and configured to supply the first power supply voltage, and the well tap cells supply a second power supply voltage to a well or the substrate in each memory cell, the well tap cells further include:

a first dummy memory cell part including a first memory-cell-structure and arranged so as to be adjacent in the first direction to each memory cell of the plurality of memory cells that is arranged at a first directional end part of the first memory sub-array, and a well tap part arranged on an opposite side of each memory cell of the plurality of memory cells with respect to the first dummy memory cell part in the first direction, and each of the first dummy memory cell part and the well tap part includes the first line.

2. The semiconductor memory device of claim 1, wherein the second power supply voltage is the same power supply voltage as the first power supply voltage.

3. The semiconductor memory device of claim 1, wherein each of the well tap cells supplies the first power supply voltage to the well or the substrate in each memory cell of the plurality of memory cells, and supplies a third power supply voltage different from the first power supply voltage to the well or the substrate in each memory cell of the plurality of memory cells.

4. The semiconductor memory device of claim 3, wherein the well tap cells further include a second line formed in the line layer, extending in the second direction, and configured to supply the third power supply voltage.

5. The semiconductor memory device of claim 3, wherein the well tap cells further include a first region of a first conductive type, and a second region of a second conductive type different from the first conductive type, the well tap cells supply the first power supply voltage to the well or the substrate through the first region, and supply the third power supply voltage to the well or the substrate through the second region.

6. The semiconductor memory device of claim 1, wherein the first memory sub-array includes third and fourth memory sub-arrays where the plurality of memory cells are arranged in an array, the third and fourth memory sub-arrays being arranged side by side in the first direction, between the third and fourth memory sub-arrays, a plurality of tap cells are arranged side by side in the second direction, and the tap cells include a third power rail formed in the first interconnect layer, extending in the first direction, electrically connected to the first power rail, and configured to supply the first power supply voltage, and a third line formed in the second interconnect layer, extending in the second direction, electrically connected to the second power rail, and configured to supply the first power supply voltage.

7. The semiconductor memory device of claim 1, wherein the memory cells further include a fourth power rail formed in the first interconnect layer, extending in the first direction, and configured to supply a third power supply voltage different from the first and the second power supply voltages, and the well tap cells further include a fifth power rail formed in the first interconnect layer, extending in the first direction, electrically connected to the fourth power rail, and configured to supply the third power supply voltage, and a second line formed in the second interconnect layer, extending in the second direction, electrically connected to the fourth power rail, and configured to supply the third power supply voltage.

8. The semiconductor memory device of claim 1, wherein the first memory sub-array includes third and fourth memory sub-arrays where the plurality of memory cells are arranged in an array, the third and fourth memory sub-arrays being arranged side by side in the first direction, between the third and fourth memory sub-arrays, a plurality of tap cells are arranged side by side in the second direction, the memory cells further include a fourth power rail formed in the first interconnect layer, extending in the first direction, and configured to supply a third power supply voltage different from the first and the second power supply voltages, and the tap cells include a third power rail formed in the first interconnect layer, extending in the first direction, electrically connected to the first power rail, and configured to supply the first power supply voltage, a third line formed in the second interconnect layer, extending in the second direction, electrically connected to the second power rail, and configured to supply the first power supply voltage, a sixth power rail formed in the first interconnect layer, extending in the first direction, electrically connected to the fourth power rail, and configured to supply the third power supply voltage, and a fourth line formed in the second interconnect layer, extending in the second direction, electrically connected to the fourth power rail, and configured to supply the third power supply voltage.

9. The semiconductor memory device of claim 1, wherein the second power supply voltage is a power supply voltage different from the first power supply voltage.

10. The semiconductor memory device of claim 9, wherein the memory cells further include a fourth power rail formed in the first interconnect layer, extending in the first direction, and configured to supply a third power supply voltage different from the first and the second power supply voltages, and the well tap cells further include a fifth power rail formed in the first interconnect layer, extending in the first direction, electrically connected to the fourth power rail, and configured to supply the third power supply voltage, a second line formed in the second interconnect layer, extending in the second direction, electrically connected to the fourth power rail, and configured to supply the third power supply voltage, a fifth line formed in the second interconnect layer, extending in the second direction, and configured to supply the third power supply voltage, a first region of a first conductive type, and a second region of a second conductive type different from the first conductive type, and the well tap cells supply the first power supply voltage to the well or the substrate through the first region, and supply the second power supply voltage to the well or the substrate through the second region.

11. The semiconductor memory device of claim 1, wherein the first dummy memory cell part includes a plurality of the first lines.

12. The semiconductor memory device of claim 1, wherein the second interconnect layer is an interconnect layer above the transistors.

13. The semiconductor memory device of claim 1, wherein a top end part of the second memory sub-array is arranged so as to be adjacent in the first direction to the well tap cells.

14. The semiconductor memory device of claim 1, wherein the well tap cells further include a second dummy memory cell part including a second memory-cell-structure and being arranged on an opposite side of the well tap part with respect to the first dummy memory cell part in the first direction, and a top end part of the second memory sub-array is arranged so as to be adjacent in the first direction to the second dummy memory cell.

15. The semiconductor memory device of claim 1, wherein a third power rail configured to supply a third power supply voltage is arranged in the first interconnect layer, and a fourth power rail configured to supply the third power supply voltage is arranged in the second interconnect layer.

* * * * *